_(12)_ United States Patent
Ruecker et al.

(10) Patent No.: US 11,656,556 B2
(45) Date of Patent: May 23, 2023

(54) APPARATUS FOR THE EXPOSURE OF PLATE-SHAPED WORKPIECES WITH HIGH THROUGHPUT

(71) Applicant: Laser Imaging Systems GmbH, Jena (DE)

(72) Inventors: Steffen Ruecker, Großloebichau (DE); Uwe Klowsky, Jena (DE)

(73) Assignee: Laser Imaging Systems GmbH, Jena (DE)

( * ) Notice: Subject to any disclaimer, the term of this patent is extended or adjusted under 35 U.S.C. 154(b) by 10 days.

(21) Appl. No.: 17/413,501

(22) PCT Filed: Dec. 11, 2019

(86) PCT No.: PCT/DE2019/101076
§ 371 (c)(1),
(2) Date: Jun. 11, 2021

(87) PCT Pub. No.: WO2020/119863
PCT Pub. Date: Jun. 18, 2020

(65) Prior Publication Data
US 2022/0057721 A1 Feb. 24, 2022

(30) Foreign Application Priority Data
Dec. 12, 2018 (DE) ...................... 10 2018 132 001.9

(51) Int. Cl.
*G03F 7/20* (2006.01)
*G03F 9/00* (2006.01)

(52) U.S. Cl.
CPC ...... *G03F 7/70716* (2013.01); *G03F 7/70025* (2013.01); *G03F 7/70733* (2013.01); *G03F 9/7088* (2013.01)

(58) Field of Classification Search
CPC ............. G03F 7/70716; G03F 7/70025; G03F 7/70733; G03F 7/2022; G03F 7/70691; G03F 7/70725; G03F 7/7075; G03F 7/70758; G03F 7/70775; G03F 7/70791; G03F 7/708; G03F 7/70808; G03F
(Continued)

(56) References Cited

U.S. PATENT DOCUMENTS 6,037,967 A * 3/2000 Allen ...................... G02B 26/12
347/261
6,590,636 B2 7/2003 Nishi
(Continued)

FOREIGN PATENT DOCUMENTS

EP 0 722 123 B1 4/1999
EP 0 951 054 A1 10/1999
(Continued)

OTHER PUBLICATIONS

English translation of JP2004-046051, published Feb. 12, 2004. (Year: 2004).*

*Primary Examiner* — Christina A Riddle
(74) *Attorney, Agent, or Firm* — Hodgson Russ LLP

(57) ABSTRACT

A movable table system comprising two identical tables on a common rail arrangement having a linear rail region underneath a detection unit and a processing unit, and therefore the tables can be alternatingly moved in a straight line along the common rail arrangement, in the same table-movement direction, fully underneath the detection unit and processing unit, and can be independently controlled by a computer unit. The movable table system provides a new option for processing planar workpieces, in which a particularly high throughput rate and improved precision can be achieved using merely one processing unit.

22 Claims, 11 Drawing Sheets

(58) Field of Classification Search
CPC ......... 7/70816; G03F 7/7085; G03F 7/70975;
G03F 7/70991; G03F 9/00; G03F 9/7088;
G03F 9/70; G03F 9/7003; G03F 9/7007;
G03F 9/7011; G03F 9/7015; G03F
9/7038; G03F 9/7042; G03F 9/7046;
G03F 9/7073–7084; G03F 9/7096; B23K
26/083; B23K 26/0823; B23K 37/0235;
H05K 13/0061; H05K 13/086
USPC ......... 355/18, 23–26, 46, 52, 53, 55, 66–71,
355/72–77, 133
See application file for complete search history.

(56) References Cited

U.S. PATENT DOCUMENTS

| | | | |
|---|---|---|---|
| 6,806,945 B2 | 10/2004 | Ise et al. | |
| 7,157,038 B2 * | 1/2007 | Baird | B23K 26/40 |
| | | | 219/121.76 |
| 2005/0254032 A1 * | 11/2005 | Ozaki | G03B 27/526 |
| | | | 355/53 |
| 2008/0187871 A1 * | 8/2008 | Fukui | G03F 7/70291 |
| | | | 355/53 |
| 2009/0208885 A1 | 8/2009 | Kiuchi | |
| 2009/0251679 A1 | 10/2009 | Shibazaki | |
| 2012/0042799 A1 * | 2/2012 | Kojima | B41J 15/04 |
| | | | 101/474 |
| 2018/0015671 A1 * | 1/2018 | Sandstrom | B33Y 10/00 |

FOREIGN PATENT DOCUMENTS

| | | | | |
|---|---|---|---|---|
| EP | 0 890 136 B1 | | 12/2002 | |
| JP | 2004046051 A | * | 2/2004 | |
| JP | 2008250072 A | * | 10/2008 | ......... G02B 26/0833 |
| JP | 2009-092723 A | | 4/2009 | |
| JP | 2010-181519 A | | 8/2010 | |
| JP | 2011048239 A | * | 3/2011 | ........... C07D 471/04 |

* cited by examiner a)

b)

US 11,656,556 B2

APPARATUS FOR THE EXPOSURE OF PLATE-SHAPED WORKPIECES WITH HIGH THROUGHPUT

PRIORITY CLAIM

The present application is a National Phase entry of PCT Application No. PCT/DE2019/101076, filed Dec. 11, 2019, which claims priority from German Patent Application 10 2018 132 001.9, filed Dec. 12, 2018, the disclosures of which are hereby incorporated by reference herein in their entirety.

FIELD OF THE INVENTION

The invention is directed to apparatus for processing plate-shaped workpieces with high workpiece throughput, in particular for increasing throughput during the direct exposure of photosensitive coatings on circuit boards or wafers for the subsequent etching of conductive tracks or electronic circuits.

Direct exposure installations are being used increasingly for the production of circuit boards and wafers. The manufacturing processes are automated to a high degree. An important production parameter for direct exposure installations is the achievable throughput. The shorter the cycle time inherent to the machinery, the more efficiently the system can be used.

The cycle time inherent to the machinery is generally given by the sum of handling time, exposure time and nonproductive time. The nonproductive time includes processes such as transporting the workpiece to processing tables, target registration, workpiece alignment and machine adjustments.

The actual processing operation, e.g., in direct exposure installations, is the exposure of the workpiece, e.g., a resist-coated substrate, wherein the exposure time is substantially predetermined by the material properties, such as for instance resist sensitivity, and by the available exposure energy. In doing so, only handling times and nonproductive times can be reduced to increase material throughput.

DESCRIPTION OF THE PRIOR ART

The prior art discloses exposure systems for plate-shaped workpieces which can expose a workpiece with a predetermined pattern through electromagnetic radiation, mainly in the visible or ultraviolet spectral range, with a laser beam or with an electron beam or particle beam. The exposure does not proceed until after producing the correct positional relationship between the workpiece with markings (target marks or targets) located thereon and a predetermined pattern stored in the exposure device. To this end, the targets located on the workpiece are acquired by a camera and the workpiece and exposure pattern are aligned with one another before or in the exposure area.

For the production of conductive tracks or very small electronic structures on plate-shaped workpieces such as circuit boards or wafers, the exposure processes, which are to be carried out with high spatial precision, and the time for handling and aligning the plate-shaped workpieces which is required for this are the limiting factors for increasing the throughput of workpieces. For this reason, it is endeavored to carry out the handling steps and exposure steps in an overlapping manner or simultaneously and—if exposure of front side and back side is desired—in the same device by turning over the workpiece in order to reduce the nonproductive time of the exposure process. Such solutions are disclosed for instance in the documents EP 0 951 054 A1, EP 0 722 123 B1, U.S. Pat. No. 6,806,945 B2 and JP 2010-181519 A.

These systems are disadvantageous in that there must either be two exposure devices with a flipping device located therebetween or two exposure devices for simultaneous exposure of the top and underside.

A solution with an individual light source for simultaneous exposure of both sides is known from JP 2009-092723 A in which two beam paths are generated via a beamsplitter, and parallel oppositely directed beam bundles through a respective photomask via mirror collimators are used to expose both sides of a substrate, wherein, however, virtually contact exposure is required and the masks needed for this purpose are extremely expensive since they are hardly adaptable in case of required changes in the exposure pattern.

SUMMARY OF THE INVENTION

The object of the invention is to provide a novel possibility for processing plate-shaped workpieces in which a particularly high throughput and improved precision are achieved with only one processing unit. As an expanded object, processing of both sides of the workpiece shall be possible with the same processing unit without requiring intermediate storage, and a reduction of the required footprint of the entire processing machine with respect to machines with equal throughput shall be achieved.

According to the invention, in an apparatus for processing plate-shaped workpieces which has a movable table system for receiving a plate-shaped workpiece and a registration unit above the movable table system for acquiring targets, and a processing unit with a controllable processing path for processing the workpiece, and which contains a computer unit for controlling the alignment between processing unit and workpiece and for spatial differentiation of a predetermined processing depending on a position of the workpiece determined on the basis of the registered targets, the above-stated object is met in that the movable table system has two identical tables on a common rail arrangement with a linear rail area below registration unit and processing unit so that the tables are movable alternately in a straight line along the common rail arrangement in a conspiring table movement direction completely under the registration unit and the processing unit and that the tables are controllable independently from one another by the computer unit.

The computer unit advantageously comprises means for independent control of the two tables with respect to direction, speed of table movement and alternate inward and outward movement of the tables for the purpose of loading and unloading plate-shaped workpieces in order to feed plate-shaped workpieces from two opposite sides of the rail arrangement for registration of the targets during the inward movement and the line-by-line processing during the outward movement depending on the determined position of the targets and a loading and unloading of the respective table which has completely moved out of a processing housing.

The registration unit advisably has a linear orientation transverse to the table movement direction and has at least two sensor areas for spatially detecting position marks at least in lateral edge areas of the tables or of the plate-shaped workpieces located on the latter during the passage of one of the tables under the registration unit.

The processing unit is advisably arranged parallel to the registration unit and has a controllable processing path transverse to the table movement direction in order to carry out a processing of the plate-shaped workpiece line by line.

The registration unit advantageously comprises cameras for detecting positions of the targets of the plate-shaped workpiece so that the position of the workpiece can be detected by means of the computer unit and presets of the workpiece dimensioning, and a signal can be generated for ending the move-in movement and introducing the move-out movement of one of the tables for carrying out the predetermined processing.

The computer unit advisably has a retarding device for reversing the direction of the move-in movement to the move-out movement of the tables with which the reversal of direction is first triggerable depending on the distance between registration unit and processing unit when a rear edge of the plate-shaped workpiece has gone beyond the processing path of the processing unit or beyond the detection area of the registration unit depending on which of the two was passed last.

It has turned out to be advantageous when the computer unit contains different speed regimes for the move-in movement to the move-out movement of the tables which are adapted to a sensing speed of the registration unit and a predefined processing speed of the processing unit, wherein the mean speed of the move-in movement is selected so as to be faster than the mean speed of the move-out movement.

The registration unit advantageously has a flash illumination for limiting the target sensing to such areas of the tables or plate-shaped workpieces located thereon in which targets are anticipated.

It has turned out to be particularly advantageous when one of the tables is provided inside the processing housing during the move-in movement for sensing the targets by means of the registration unit and during the move-out movement for line-by-line processing by means of the processing unit, wherein the other table is simultaneously guided to loading and unloading of the workpieces in the moved-out state outside of the processing housing.

Two grippers working in parallel transverse to the table movement direction are preferably provided outside of the processing housing for loading and unloading one of the tables, respectively, at each exit side of the rail arrangement.

The apparatus according to the invention advantageously comprises a transporting system for providing the plate-shaped workpieces for processing on both sides outside of the processing housing and inside of an outer machine housing, with which transporting system the workpieces which are processed on one side are transferable from the one exit side of the rail arrangement to the other exit side of the rail arrangement accompanied by a flipping movement.

In a first advisable embodiment, two articulated arm robots are provided as transporting system, which articulated arm robots have a two-sided rotatable gripper head which is configured by rotation of the gripper head to remove a completely processed workpiece and deposit a workpiece that has not yet been finished, and which articulated arm robots are provided for an inherent flipping movement by transferring workpieces which are processed on one side from one articulated arm robot to the other.

Alternatively, in a second preferred embodiment, a roller conveyor is provided as transporting system, which roller conveyor is arranged adjacent to the common rail arrangement and is complemented by a doubled arrangement of grippers which are movable transverse to the table movement to remove a completely processed workpiece and deposit a workpiece that has not yet been finished.

A flipping device is advantageously integrated in the roller conveyor as a fork-shaped turnover flap which is swivelable at a longitudinal side of the turnover flap in the roller plane of the roller conveyor, wherein the plate-shaped workpiece is movable into fork openings of the fork-shaped turnover flap and out of the fork openings after a swivel movement of the turnover flap by means of conveying rollers of the roller conveyor.

The flipping device is preferably formed as a fork-shaped turnover flap in such a way that it is swivelable at its longitudinal side in the roller plane and is fixable in a 90° position with respect to the conveyor plane, wherein the plate-shaped workpiece is movable by means of the conveying rollers of the roller conveyor through a slot between swivelable longitudinal side and fork elements of the fork-shaped turnover flap without flipping.

Advantageously, grippers which are movable transverse to the table movement direction for loading and unloading the respective moved-out table are provided outside of the processing housing at each exit side of the rail arrangement of the table system, which grippers are formed for both removing a processed workpiece and placing a workpiece that has not been processed or not yet been completely processed at each exit side of the rail arrangement as a doubled arrangement of grippers operated in parallel.

Furthermore, the registration unit and the processing unit are preferably arranged as a parallel double unit directly adjacent to one another centrically above the rail arrangement of the table system in order to sense and process the two tables from both sides with one and the same registration unit and processing unit in each instance, wherein locations of the targets which are detected in on-the-fly registration and processing regime during the move-in movement of the table and which deviate from a template processing pattern are to be taken into account immediately during the move-out movement of the table in order to adapt the deviations of the position of the targets for the alignment of the processing pattern by allowing for the deviations in the data of the processing pattern.

Alternatively, the registration unit can be divided into two registration devices which are arranged at both sides of the processing unit so that the regime of on-the-fly registration and processing can be realized simultaneously, but alternatively alternating for both tables.

Furthermore, the registration unit for target sensing has advisably at least two cameras arranged on a line transverse to the table movement direction, wherein the position along the line is adjustable depending on the anticipated position of the targets on the workpiece. The cameras are preferably outfitted with a flash device to allow image captures during fast table movement with short shutter times. Optionally, the cameras outfitted with a flash device with short shutter times for fast table movement in longitudinal direction are additionally provided for image captures transverse to the table movement during slow or stopped table movement when a plurality of targets are not arranged in the edge area of the table or workpiece and when the other table is in the processing regime.

The processing unit is preferably formed as a line-by-line scanning exposure unit in order to provide photosensitive layers with an exposure pattern.

The exposure unit advisably comprises a controllable light source for exposure of workpieces with a scanned laser beam, e.g., controlled by means of a polygon mirror.

Furthermore, the processing unit can advantageously be formed as a laser processing unit in order to process workpieces by means of a controlled laser beam by laser ablation or laser cutting.

In a further preferable embodiment, the processing unit is formed as a material deposit unit in order to process workpieces by means of controlled material application. For this purpose, the processing unit can advisably be formed as a laser processing unit according to the LIFT technology in order to apply solid materials of donor layer substrates as coating patterns to workpieces through controlled laser-induced forward transmission. Or the processing unit is formed as an ink-jet unit in order to apply transient liquid materials as coating patterns to workpieces by means of controllable nozzles.

The invention is based on the fundamental consideration that the throughput during the processing of workpieces under fixed process parameters can only be increased when the processing unit is utilized to the fullest virtually continuously by desired processing operations, as, for instance, exposure processes, and the handling times and nonproductive times are shortened in particular in that the target registration and the alignment of the workpiece in relation to the processing pattern are similarly carried out continuously and parallel with the processing operation, and interruptions in processing due to changing workpieces take up as little time as possible. According to the invention, the stated object is met in that two tables are arranged in a plane on a common linear guide system in order to reduce workpiece changing time to a table changing time during the passage through the processing unit. The two tables move independently of one another along the same guide rails of the linear guide system and can approach one another up to a predetermined minimum distance during movement, moving in the same or opposite movement directions at the same speeds or at different speeds.

A processing path conducted transverse to the table movement direction propagating line by line, preferably with a laser scanner, is used for a desired processing operation, wherein a registration unit is needed for acquiring the position of the workpieces or targets located thereon which are formed, for example, as circular targets or through-holes in order to ensure the precision required. The registration unit comprises cameras (two or more cameras with area sensors or linear sensors) which are movable transverse to the table movement direction so that edges or targets of the workpieces can be acquired in any optional position. In this way, the registration times through strip-shaped target captures can be adapted to the proven line-by-line processing, preferably exposure with a scanned laser line. Full-frame evaluations of the entire workpiece for acquiring targets can be avoided and the alignment of the processing pattern with the position of the workpiece detected through the target registration can be produced by means of electronic alignment of the processing data. Further, the cameras should have dynamic characteristics (high image capture rate) which permit a gapless acquisition of the workpiece during the table movement (in y-direction) and accordingly allow a flying target acquisition in running operation of the table movement for the immediately successive processing operation ("on-the-fly" registration).

Since charging the table for instance with rectangular workpieces, e.g., circuit boards, in itself allows a very precise alignment with the table coordinates, the target registration in such cases can be used directly for calculating an electronically adapted alignment of the processing patterns without further intermediate storage of image data ("on-the-fly" alignment). Accordingly, any mechanical table corrections or workpiece position corrections are obviated and the nonproductive time for alignment is saved in practice and is combined with the running data stream preparation.

Further, the mechanical throughput of the processing unit is increased in that the processing unit is fully utilized from two sides with two separately controllable tables passing through alternately.

It is also expedient to reduce the traveling distance of the two tables for maximizing machine efficiency and workpiece throughput. The total length of the system is given by four table lengths plus safety distances and the zones of the registration unit and processing unit arranged in the middle of the overall system. Every workpiece passes completely through both registration unit and processing unit (the sequence varies depending on the table entrance side) during a processing operation initially at a permissible registration speed and, after reversing direction, the processing/exposure takes place on the return path at a predetermined processing speed. The processing speed is determined by the predetermined exposure time mentioned above, e.g., during the exposure of a photosensitive resist coating. The dimensions of the registration unit and processing unit in y-direction have a decisive influence on the total traveling distances of the tables.

In known DMF-based exposure systems (Digital Micromirror Device) which require either an x-y movement with at least two rows with offset DMF heads and typically have a substantial y-dimension of the exposure zone greater than 120 mm, the present invention would have to take into account longer traveling distances of the tables in comparison to a preferably used polygon scanner which has a beam bundle with a dimension in y-direction of appreciably less than 0.5 mm and, therefore, has only a minimal influence on the required table traveling distances. The increased demand for traveling distances of the tables for other processing units that make use of liquid or droplet jets should be assessed in a similar way, e.g., when applying materials using ink-jet technology, for instance paints, varnishes, adhesives, resists and solder stop markers etc.

Further, it is made possible by different handling systems adapted to the apparatus to carry out processing of both sides of a workpiece in a workpiece flow through the same processing equipment. Charging the processing unit on both sides can be utilized in a particularly advantageous manner for this purpose by using a handling unit preferably mounted inside the machine housing which realizes the table-to-table transport of the workpiece processed on one side with its inherent rotation, while at the same time a further workpiece is loaded and processed on the one side of the apparatus which is chargeable on two sides.

With the present invention, it is possible to make the processing of plate-shaped workpieces such as for instance circuit boards or wafers more efficient in such a way that a particularly high throughput is achieved with one processing unit by means of two separate tables which are operated in opposing directions on a common rail arrangement. In this way, not only the throughput, but also the precision of processing on both tables is increased due to the use of the same common rail arrangement. With an adapted handling system, a processing of both sides of a workpiece is made possible in a particularly efficient manner with the same processing unit with a single workpiece flow such that no intermediate storage or second downstream processing unit is required, wherein a reduction of the required footprint of the entire processing machine is achieved in comparison to machines with equal throughput.

BRIEF DESCRIPTION OF THE DRAWINGS

The invention will be described more fully in the following with reference to embodiment examples. The drawings show.

DETAILED DESCRIPTION

Figure 1:
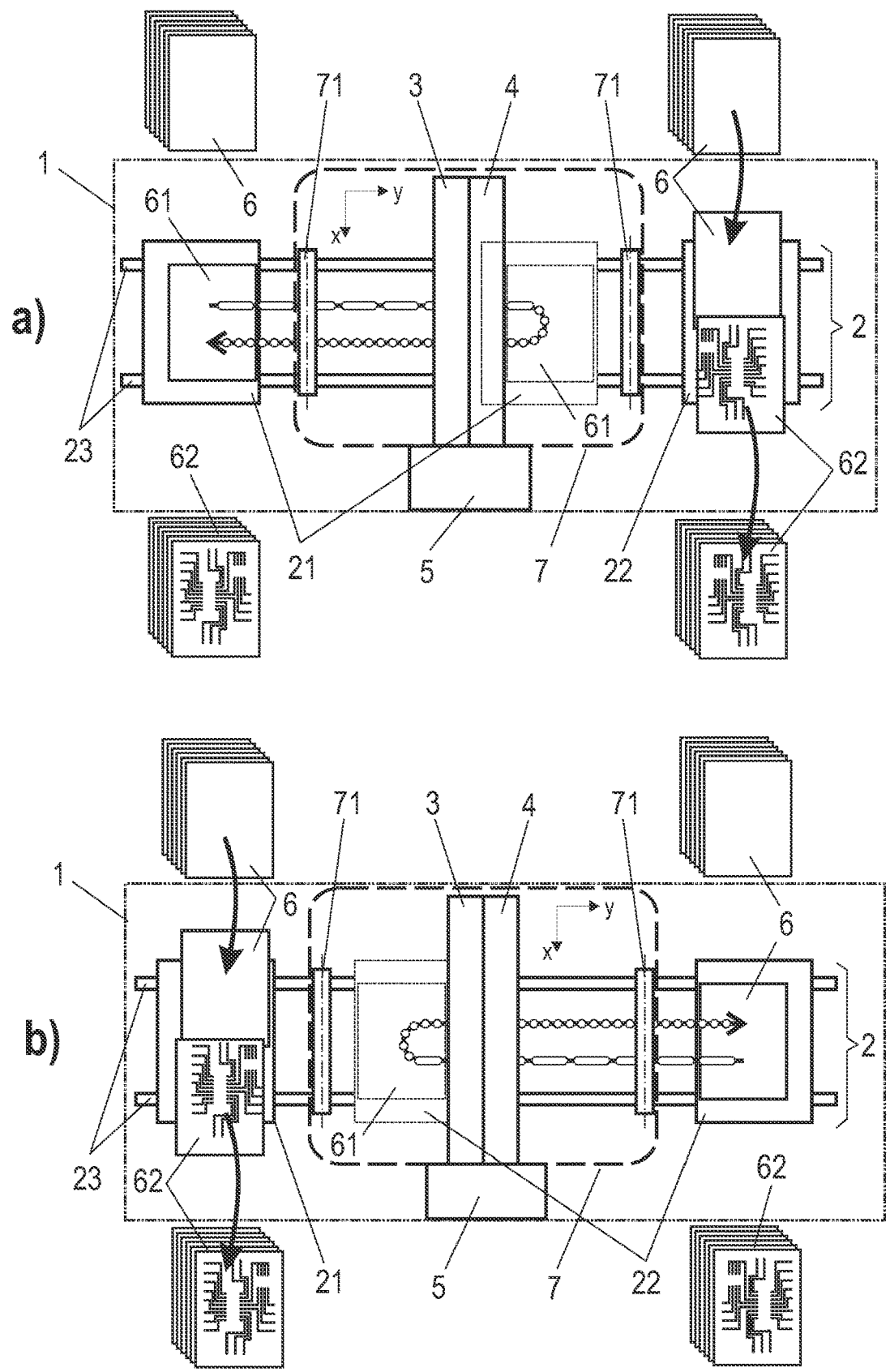
FIG. 1 two schematic diagrams of the processing apparatus according to the invention with two-sided alternate charging with plate-shaped workpieces in which subfigure a) shows the registration and processing of the workpiece situated on the left-hand side and the changing of workpieces on the right-hand side and subfigure b) shows the registration and processing of the workpiece situated on the right-hand side and the changing of workpieces on the left-hand side.

As is shown schematically in FIG. 1, a processing device 1 according to the invention for processing plate-shaped workpieces 6 comprises a movable table system 2 for receiving and moving the workpiece 6 and, above the movable table system 2, a registration device or unit 3 for acquiring targets 33 (shown only in FIGS. 8 and 10) and a processor or "processing unit" 4 formed as a processing station scanning the workpiece 6 line by line transverse to the table movement direction and includes a computer or "computer unit" 5 for controlling the alignment between processing unit 4 and workpiece 6 and spatial differentiation of a predetermined processing depending on the position of the workpiece 6 determined on the basis of the registered targets 33.

The movable table system 2 has two identical tables 21 and 22 on a common rail arrangement 23 (in terms of a common linear guide system) with a linear rail area preferably formed by two rails below the registration unit 3 and the processing unit 4 so that the tables 21, 22 are movable alternately in a straight line along the common rail arrangement 23 in a conspiring table movement direction (y direction) completely under the registration unit 3 and the processing unit 4.

The registration unit 3 has a linear orientation transverse to the table movement direction and has at least two sensor areas for spatially detecting position marks at least in lateral edge areas of the tables 21, 22 or of the workpieces 6 located on the latter during the passage of one of the tables 21, 22 under the registration unit 3. The sensor areas are preferably formed by compact cameras 31 which can be area cameras or line cameras, for example.

The processing unit 4 is advantageously formed as a processing station arranged parallel to the registration unit 3 and having a controllable processing path transverse to the table movement direction, preferably in the form of a scanned processing beam, in order to carry out a line-by-line processing of the plate-shaped workpiece 6. Linearly scanned laser beams, in particular, but also electron beams or particle beams may be considered for controllable processing paths. They can be used in a particularly preferred manner in a line-by-line scanning exposure unit 41 (see FIG. 2 or 4) for direct exposure. Alternatively, however, the processing unit 4 may also have another processing station which is controllable linearly and line by line, such as, e.g., a laser cutting device or other laser processing systems, such as for instance, a laser ablation unit or a LIFT system, i.e. Laser Induced Forward Transfer System (not illustrated, see e.g., https://www.hiperlam.eu/technologies) or an ink-jet unit 42 (only illustrated in FIG. 7) or other material deposit systems.

The computer unit 5 is outfitted with means for independent control of the two tables 21, 22 with respect to direction, speed of table movement and alternate inward and outward movement of the tables 21, 22 for the purpose of loading and unloading in order to feed plate-shaped workpieces 6 from two opposite sides of the rail arrangement 23 for registration of the targets 33 during the inward movement and a line-by-line processing during the outward movement. The processing is controlled according to an alignment between processing unit 4 and workpiece 6 and with spatial differentiation according to a predetermined processing pattern by the computer unit 5 depending on a position of the workpiece 6 determined on the basis of the registered targets 33. Further, the computer unit 5 provides for the loading and unloading of one of the tables 21 or 22 which alternately move completely out of the processing housing 7. The processing housing 7 surrounds a space which is outfitted with cleanroom conditions and which contains the processing device 1 with registration unit 3 and processing unit 4 in the center as well as a space of at least one table length which extends in both directions to the respective exit areas of the rail arrangement 23. In the working variant shown in FIG. 1, the processing housing 7 has cleaning elements (cleaners 71) at the two opposite exit areas of tables 21, 22 for cleaning the surface of the workpieces 6.

The parallel workpiece processing, according to the invention, in the processing device 1 will now be described referring to the two subfigures in FIG. 1. Subfigure a) shows the process wherein the first table 21 is already loaded with an unprocessed workpiece 61 and moves into the processing housing 7 along the rail arrangement 23, passes through the cleaners 71 and completely traverses the registration unit 3 initially and, immediately thereafter, the processing unit 4 along the move-in direction shown in large dashes. The unprocessed workpiece 61 must pass through both units 3 and 4 and at least all portions of the unprocessed workpiece 61 must have exited the registration unit 3 and processing unit 4, while table 21 has possibly not completely passed through when the table 21 has a larger surface area than the unprocessed workpiece 61 as is shown by the fine-dashed silhouette of unprocessed workpiece 61 and table 21. This can save valuable time the greater the difference in surface area between table 21 and workpiece 61.

While passing through the registration unit 3, the unprocessed workpiece 61 has already been sensed with respect to the target marks 33 arranged on it, preferably targets or through-holes. For this purpose, the registration unit 3 contains cameras 31 (two or more cameras with area sensors or linear sensors) which are movable in x-direction in order to acquire any optional position on the unprocessed workpiece 61. During regular operation, however, the unprocessed workpieces 61, the dimensions of the unprocessed workpieces 61 and the quantity of targets 33 located on them are precisely known so that the cameras 31, while movable, are fixedly pre-adjusted for sensing the targets of an actual workpiece charge. A movement of the cameras 31 can also be dispensed with when a combination of either area cameras or line cameras can gaplessly acquire the entire width of the table 21, 22.

For the targets 33 to be sensed immediately (on the fly) upon passing through, the cameras 31 must possess dynamic characteristics (high frame capture rate), which permits a gapless acquisition of the unprocessed workpiece during the movement in table movement direction (y-direction). "On-the-fly" registration as used herein means that the position data of the targets 33 and, accordingly, the position of the unprocessed workpiece 61 are processed by the computer unit 5 directly for the alignment between unprocessed workpiece 61 and processing pattern by adapting the processing data for the processing in the processing unit 4.

When the first table 21 has concluded its inward movement in that all portions of the unprocessed workpiece 61 have passed the registration unit 3 and processing unit 4, the computer unit 5 reverses the movement direction of the first table 21 and it passes backwards through the processing unit 4 and the registration unit 3 as shown by the large-dotted movement line. The line-by-line processing of the unprocessed workpiece 61 is carried out in the processing unit 4.

In a parallel time segment, a workpiece 62 processed on one side has been unloaded from the second table 22 on the right-hand side of subfigure a) and a new unprocessed workpiece 61 has been loaded on the second table 22.

Accordingly, the second table 22 is ready for processing even before the first table 21 has exited the processing housing 7 and, even as the first table 21 undergoes processing, can already move into the processing housing 7, pass through the cleaners 71 and follow table 21 at a minimum distance. This process is shown in subfigure b) of FIG. 1.

The second table 22 moves according to the large-dashed movement line into the processing housing 7, initially passes through the processing unit 4 without being processed and is subsequently sensed "on the fly" with respect to the positions of the targets 33 while passing through the registration unit 3. Table 22 must again move through the registration unit 3 until the unprocessed workpiece 61 has exited the registration unit 3 completely (all portions thereof). The movement direction of table 21 is then reversed and the computer unit 5 provides for the adapted and aligned processing of the processing pattern in processing unit 4.

As the second table 22 moves in, the first table 21 simultaneously exits the processing housing 7 at the opposite side, the workpiece 62 processed on one side is unloaded from it and a new unprocessed workpiece 61 is loaded, and the first table 21 is accordingly ready to move in again, which begins precisely when the second table 22 passes the line-by-line processing in the processing unit 4 after reversing direction. At the conclusion of the processing on the second table 22, the procedure according to subfigure a) in FIG. 1 takes place again, and the process according to subfigure b) continues, and so on.

In order to reduce the table changing time as much as possible, the two tables 21, 22 are moved as close to one another as possible in a plane on the common rail arrangement 23. The two tables 21, 22 move independently of one another in each instance in y-direction from one of the two ends of the rail arrangement 23 and can approach one another during the table movement up to a predetermined minimum distance, can move at the same speed or at different speeds and in the same movement direction or in different movement directions.

Figure 2:
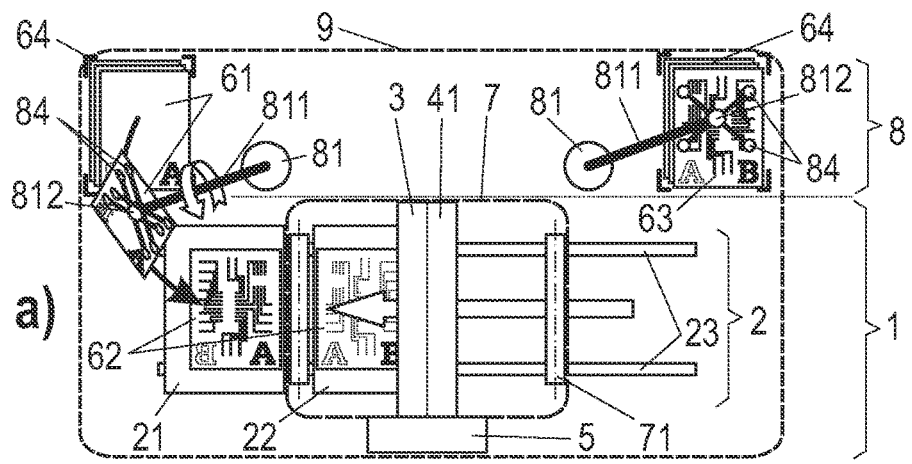
FIG. 2 an eight-part diagram (subfigures a to h) of a schematic process flow of the workpiece processing and the concurrent workpiece handling by means of two articulated arm robots.
Figure 2:
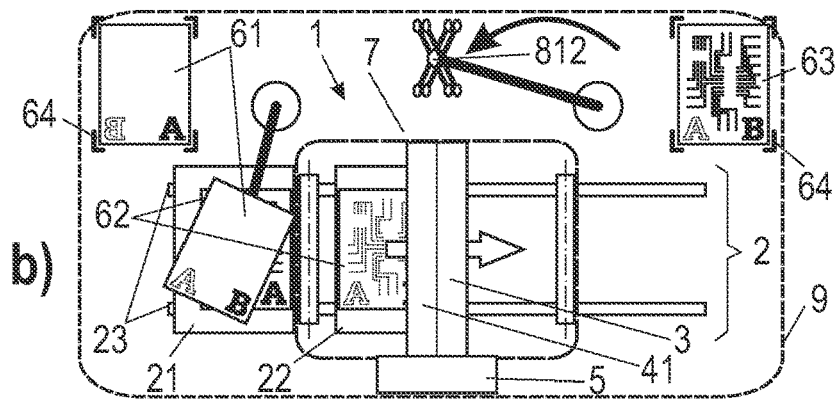
Figure 2:
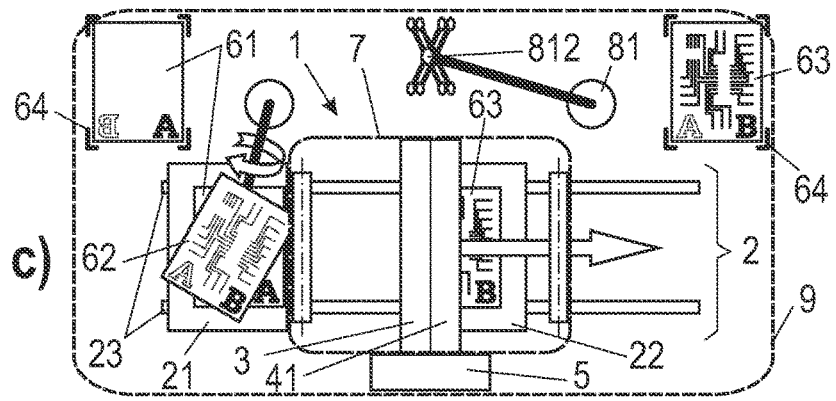
Figure 2:
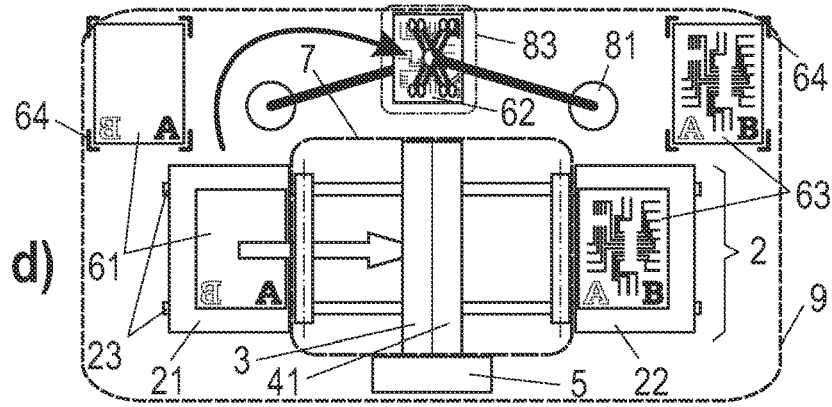
Figure 2:
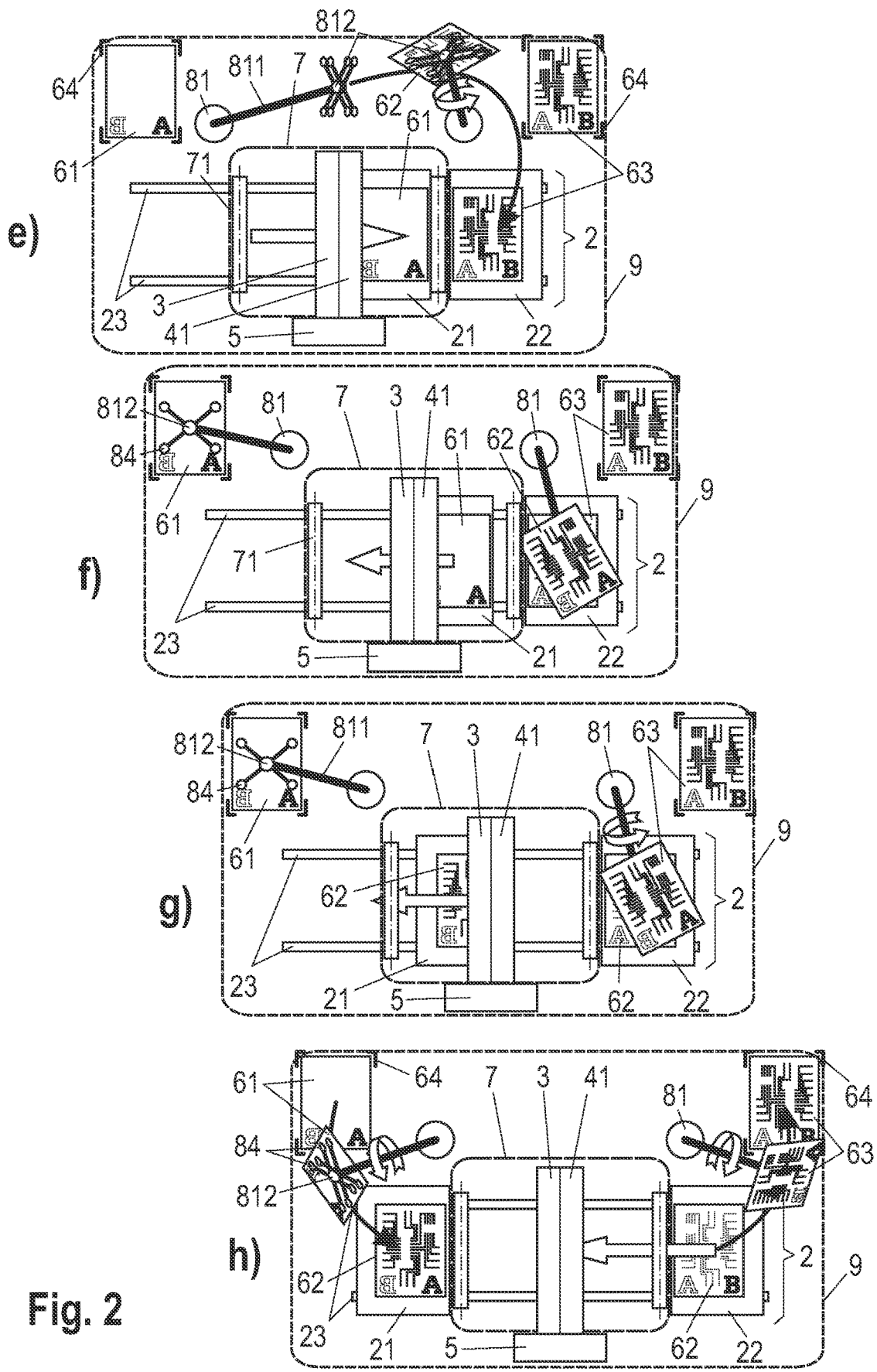

The process flow of the processing of workpieces 6—in this case, circuit board exposure, for example—is shown in FIG. 2 in eight subfigures a) to h) with an associated handling system 8 which, in addition to the parallel processing variant shown in FIG. 1, permits the processing device 1 to be utilized for processing the front side and back side of the workpieces 6.

In FIG. 2, all subfigures contain the processing device 1 as shown in FIG. 1 in a variant in which—without loss of generality for all applicable processing operations—the processing unit 4 is formed as an exposure unit 41 with a controllable light source for exposure of workpieces 6, preferably with a laser beam scanned by means of a polygon mirror, wherein the rail arrangement 23 extends out of the processing housing 7, as shown in FIG. 1, in order to allow for alternating loading and unloading of the tables 21 and 22.

In this embodiment, a handling system 8 is provided outside of the processing housing 7 for workpiece charging on both sides of the same, which handling system 8 is housed in an outer machine housing 9 surrounding the processing device 1 including the table system 2 with the protruding rail arrangement 23 and comprises two articulated arm robots 81 which are each associated with one of the tables 21, 22 and ensure unloading of workpieces 62 exposed on one side and loading of new unexposed workpieces 61 on the tables 21, 22.

In this specific example, the handling system 8 contains two identical articulated arm robots 81, each of which can load or unload workpieces 6 at the respective moved-out table 21 and 22 at a respective end of the rail arrangement 23.

Each articulated arm robot 81 has a (preferably multi-sectional) articulated arm 811 and a rotatable double-sided head 812 which is outfitted with two grippers 84 which are arranged at opposite surfaces and, for instance, contain a vacuum system. The articulated arm robots 81 are arranged in such a way that they can access the associated table 21 and 22 in each instance and can contact the other articulated arm robot 81. When the two articulated arm robots 81 contact each other, one articulated arm robot 81 can transmit a one-sided processed workpiece 62 in a middle position at one half of the distance from the other articulated arm robot 81 by its grippers 84 arranged at the double-sided head 812, whereas the other articulated arm robot 81 takes over the workpiece 62 in a "mirrored alignment". The processing and handling operation is carried out as described below with respect to the eight subfigures of FIG. 2, wherein letter A is used for marking the front side and B for marking the back side of each workpiece 6, a full letter marking the visible upper side and a hollow letter marking the non-visible bottom side of the workpieces 6.

Furthermore, it shall be noted that the workpiece stacks 64 have always been illustrated inside the machine housing 9 in all subfigures only for a more compact simplified depiction, even though they are usually provided by external handling devices.

Subfigure a) shows a snapshot of the processing device 1 inside the machine housing 9, in which a workpiece 62 which is exposed (on one side) has exited the processing housing 7 on the first table 21 along rail arrangement 23. As is shown in subfigure a) of FIG. 2, a new unexposed workpiece 61 is received at the one surface of the double-sided head 812, the head 812 rotates and swivels over the first table 21. Simultaneously, a workpiece 62 which is exposed on one side is moved on the second table 22 through the registration unit 3 and exposure unit 4 to carry out the sensing of the targets 33 in the move-in direction marked by the hollow arrow. Further, the articulated arm robot 81 deposits a workpiece 63 which has been exposed on both sides in a workpiece stack 64, this workpiece 63 having been removed from the second table 22 shortly beforehand. This articulated arm robot 81 subsequently swivels into the middle position at one half of the distance from the articulated arm robot 81 of the first table 21, as shown on the right-hand side of subfigure b).

The articulated robot 81 at the first table 21 has stopped over the first table 21 as is shown in subfigure b), carries the unexposed workpiece 61 on the upper surface of the double-sided head 812 and is lowered onto the first table 21 by the bottom surface to receive a workpiece 62 from the first table 21 that has already been exposed on one side. The line-by-line exposure proceeds at the same time on the second table 22 in the move-out direction of the table 22.

In subfigure c) of FIG. 2, the exposure on the second table 22 is concluded, and the table 22 is moved out of the processing housing 7 at higher speed. After the workpiece 62 which has been exposed on one side is received, the articulated arm robot 81 at the first table 21 rotates head 812 by 180° once again and then places the unexposed workpiece 61 on table 21.

According to subfigure d), the articulated arm 811 swivels with the workpiece 62 which is exposed on one side and is located at the other surface of the double-sided head 812, from the first table 21 to the middle position at one half of the distance from the other articulated arm robot 81 which waits without loading, and docks at the available surface of the double-sided head 812 to transfer the workpiece 62 which is exposed on one side. In the meantime, the workpiece 63 which is exposed on two sides and lies on the second table 22 has exited the processing housing 7 and the first table 21 moves into the processing housing 7 to the registration unit 3 from the other side.

As is shown in subfigure e), the articulated arm robot 81 associated with the second table 22 pivots to the workpiece 63 exposed on both sides on the second table 22 and, in doing so, rotates its head 812 so that the free surface of head 812 can receive workpiece 63 which is exposed on both sides. At the same time, the first table 21 with the unexposed workpiece 61 placed thereon has passed the registration unit 3 in the processing housing 7 and has almost passed through the exposure unit 41, wherein the registration of the targets 33 has been carried out in the registration unit 3.

As is shown in subfigure f), the first table 21 reverses its movement direction after at least the unexposed workpiece 61 has passed completely through the exposure unit 41 and begins the exposure process in the exposure unit 4 during the move-out movement. Simultaneously, the associated articulated arm robot 81 receives the workpiece 63 which is exposed on both sides at the second table 22 and afterwards—as can be seen in subfigure g)—articulated robot 81 rotates head 812 by 180° in order to deposit the workpiece 62 which is exposed on one side and taken over by the articulated robot 81 of the first table 21 on the second table 22. During this time, in subfigure g) the exposure procedure on the first table 21 is concluded and the first table 21 then moves out at increased speed.

In subfigure h) of FIG. 2, the articulated arm robot 81 at the first table 21 receives a new unexposed workpiece 61 from the workpiece stack 64 in order to subsequently exchange the workpiece 62 which is exposed on one side and has moved out of the processing housing 7 for an unexposed workpiece 61—as has already been described referring to subfigures a) and b). Simultaneously, the articulated arm robot 81 at the second table 22 has deposited the already received workpiece 63 which is exposed on both sides in a corresponding workpiece stack 64, and the second table 22 begins to move the already deposited workpiece 62 which is exposed on one side into the processing housing 7 for registration in the registration unit 3 at the maximum possible registration speed. The whole process from subfigure a) onward is then repeated.

Figure 3:
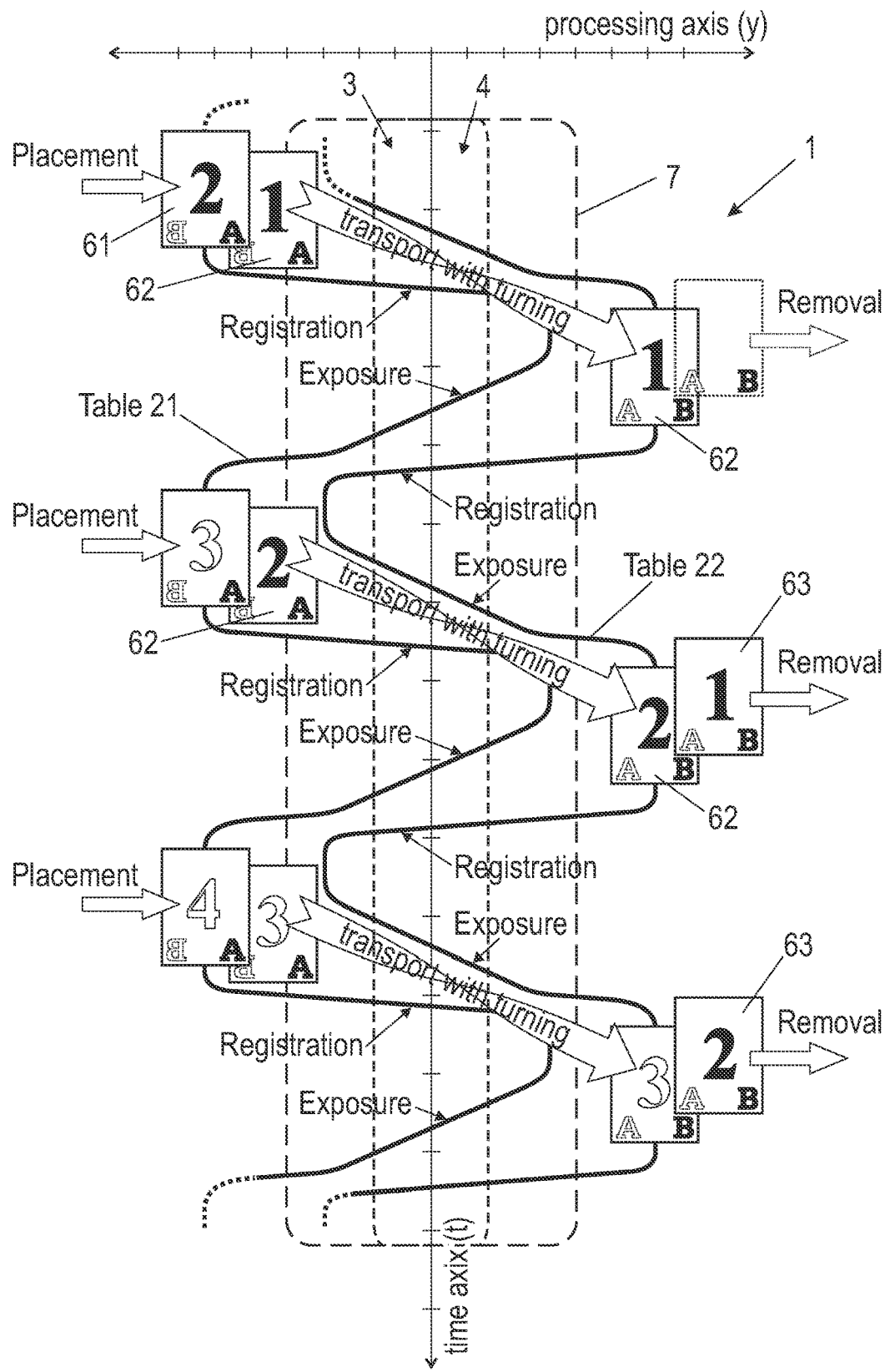
FIG. 3 a timing diagram for the flow of registration and processing and a table-to-table transport with turning of the workpiece for back side processing.

The above-described flow is shown again in FIG. 3 as a location-time schema to illustrate the tight control of the movement of tables 21, 22, shown as a black, solid zigzag line. The time axis t is drawn vertically along the spatial center line of registration unit 3 and processing unit 4 and allows the different speeds of tables 21 and 22 to be discerned. The registration is carried out during the steeper rise, i.e., at higher table speeds, while the exposure is carried out in the areas with a flatter rise, i.e., at slower speeds. Tables 21 and 22 come to a standstill (monotonically) outside of the processing housing 7.

Figure 4:
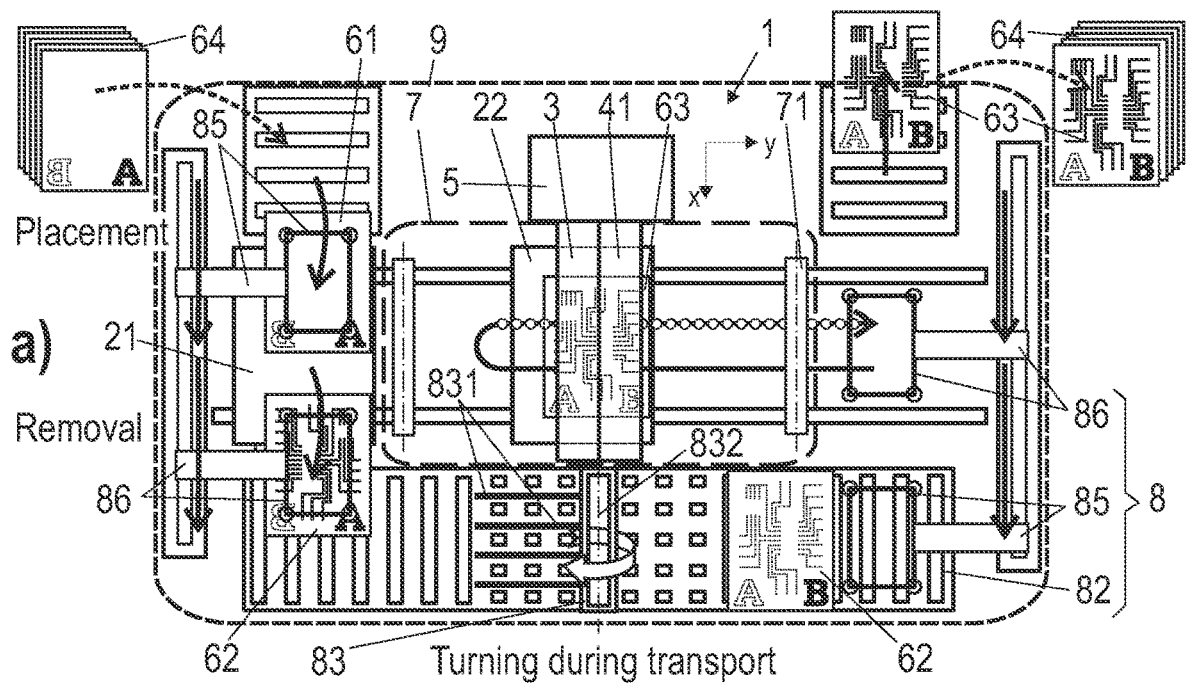
FIG. 4 a two-part diagram (subfigures a and b) of a schematic flow of an alternative workpiece handling compared to FIG. 2 by means of a roller conveyer.
Figure 4:
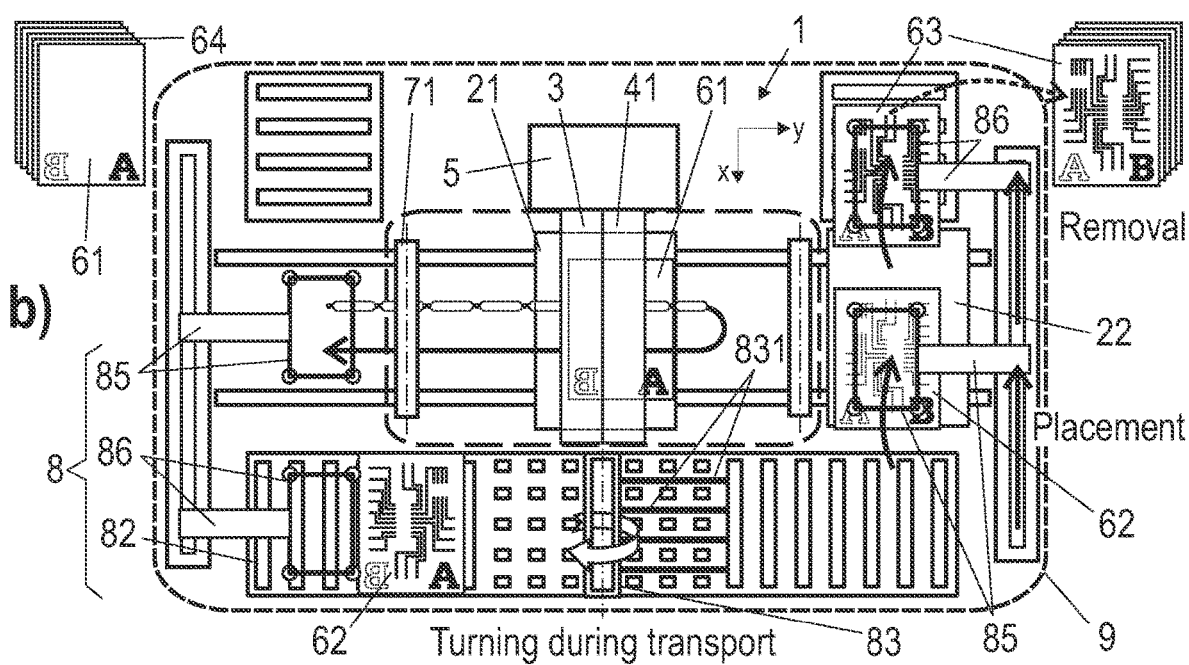
Figure 5:
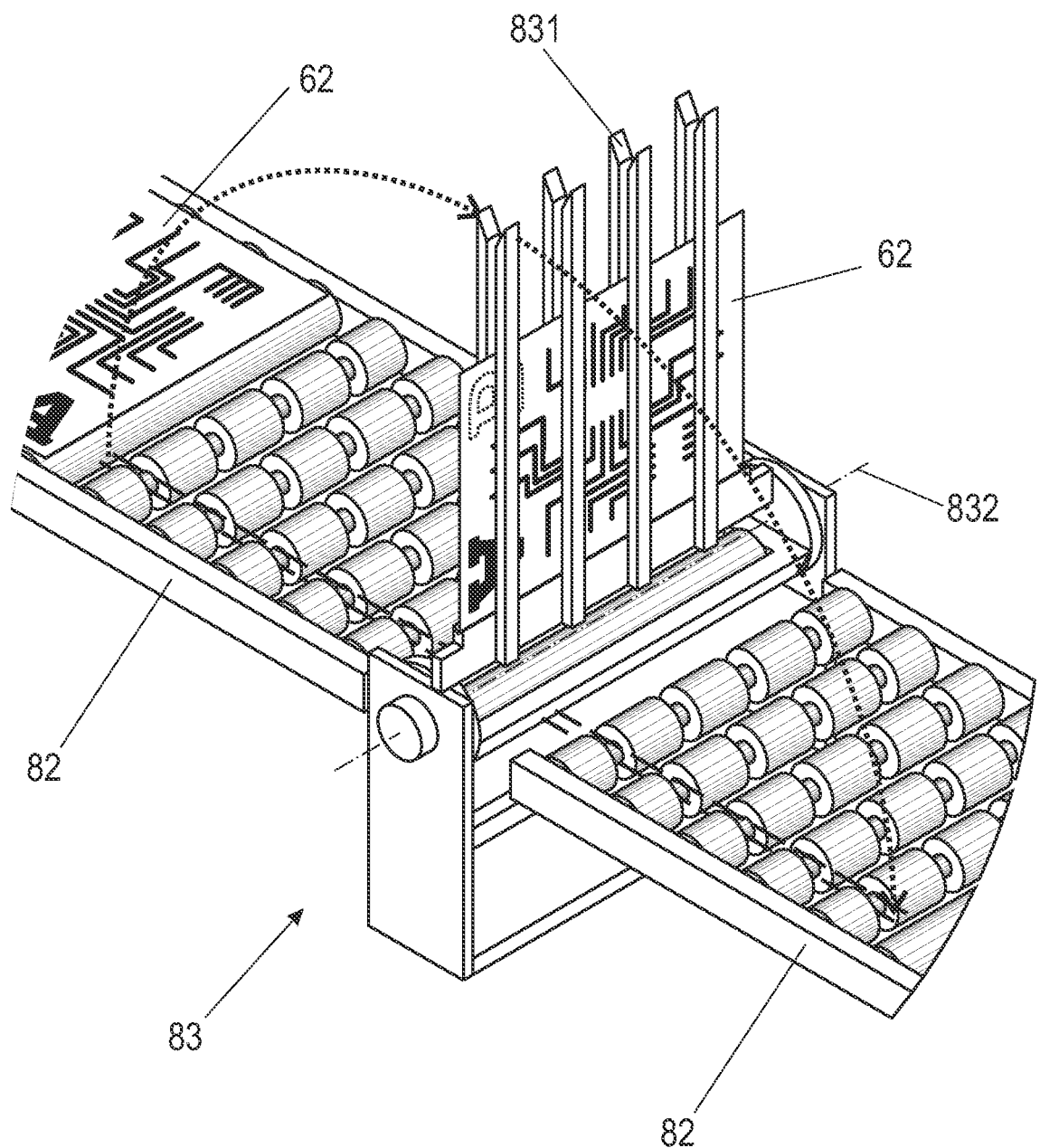
FIG. 5 a detailed view of the flipping device with arrows showing the movement flow.

The flow chart in FIG. 3 illustrates with a curved arrow strip in a stylistically simplified manner the table-to-table transport carried out with a handling system 8, e.g., by means of articulated arm robots 81 (according to FIG. 2) or roller conveyer 82 (according to FIG. 4) and the turning of the workpiece by means of a flipping device 83 (e.g., according to subfigure d) in FIG. 2, as workpiece transfer between the double-sided heads 812 of the two articulated arm robots 81 or, according to FIGS. 4 and 5, through a fork-shaped turnover flap 831) for processing (exposure) on both sides of the workpieces 6. This registration and exposure procedure for two workpieces 6 is shown in its entirety in FIG. 3 with solid numerals 1 and 2 for front side A and back side B. The workpieces 6 with the hollow numerals 3 and 4 illustrate the concurrently running processes for the next workpieces 6. The workpieces designated by reference numerals 61, 62 and 63 show the distinction between unexposed workpiece 61, workpiece 62 which is exposed on one side and workpiece 63 which is exposed on both sides.

The diagram in FIG. 4 has two subfigures a) and b) showing a handling system 8 in the form of roller conveyors 82 which can be used as an alternative to FIG. 2.

In this example, the processing device 1 is constructed in the same way as in FIG. 1, however, the processing unit 4—again without loss of generality—is formed as an exposure unit 41. A complete handling system 8 is arranged around the processing device 1 in an outer machine housing 9 which can be used in combination with the processing device 1 as an alternative to the one used in FIG. 2 in order to feed the workpieces 62 exposed on one side to back-side exposure in the same processing device 1 without intermediate stacking.

In this embodiment, the handling system 8 contains a roller conveyor 82 which transports workpieces 62 exposed on one side from the first table 21 to the second table 22, two doubled arrangements of two grippers 85 and 86 each which carry out parallel loading and unloading of the respective table 21, 22, and a flipping device 83 which is provided on the way along the roller conveyor 82 in order to turn the exposed upper side upside down during a table-to-table transport of the workpieces 62 exposed on one side and thus to expose the workpieces 6 on both sides in one machine flow by using the processing device 1 two times.

In this embodiment of the invention according to FIG. 4, subfigure a) shows the concurrently running processes with respect to the first table 21 and the second table 22. While the workpiece 62 which is exposed on one side is exchanged for an unexposed workpiece 61 on the first table 21 which has moved out of the processing housing 7, the exposure process takes place simultaneously on the second table 22, the second table 22 having followed close behind the first table 21 during the move-out movement of the latter enabling the sensing of targets 33 (shown only FIG. 8) in the registration unit 3.

The unloading and loading of the first table 21 takes place with two grippers 85 and 86 moving in parallel (in x-direction). Gripper 85 receives and lifts (for example, pneumatically) an unexposed workpiece 61 made available beforehand on the roller conveyer 82 from a workpiece stack 64 and, simultaneous with this, gripper 86 in like manner receives and lifts the workpiece 62 which is exposed on one side and which lies on the first table 21. Both grippers 85, 86 then move in x-direction (transverse to the table movement direction) until gripper 85 deposits the unexposed workpiece 61 at the correct place on the table 21 and gripper 86 can transfer the workpiece 62 exposed on one side to the roller conveyer 82 on the other side of the table 21. During this exchange procedure, the second table 22 has already moved through the exposure unit 41 and concludes its move-out movement by exiting the processing housing 7. This state is reached in subfigure b) in FIG. 4. However, the first table 21 already follows directly close behind the move-out movement of the second table 22 and, in so doing, has traversed the registration unit 3 and the exposure unit 41, exclusively the registration unit 3 having fulfilled its task of sensing targets "on the fly" so that the exposure pattern which is calculated in the computer unit 5 so as to be adapted to the target deviations is made available for the exposure to be carried out in the exposure unit 41 after the reversal of direction of the first table 21.

Within this time period, the removal of the workpiece 63 which is exposed on both sides and the concurrent placement of the workpiece 62 which is exposed on one side and transported from the first table 21 via the roller conveyer 82 and which has been turned over on the way to the second table 22 takes place at the moved-out second table 22. The turning of the workpiece 62 exposed on one side is carried out by the flipping device 83 which is integrated in the roller conveyer 82 in the gaps of divided rollers and is formed as a fork-shaped turnover flap 831 which is rotated at one longitudinal side. An enlarged detail of this preferred embodiment is shown in FIG. 5 and will be described more exactly in the following.

Two grippers 85, 86 which are movable in parallel in x-direction as on the side at the first table 21 and which are preferably outfitted with pneumatic elements are provided again for unloading and loading the second table 22. Gripper 86 receives the workpiece 62 which is exposed on both sides and gripper 85 lifts the workpiece 62 which is exposed on one side from the roller conveyor 82 and both are moved in the same direction (x-direction) until the workpiece 62 which is exposed on one side can be deposited at the correct place on the second table 22 and the workpiece 63 which is exposed on both sides is deposited on the separate segment of the roller conveyor 82 so that both workpieces 62 and 63 can be deposited and the next cycle begins as shown in subfigure a) in FIG. 4.

FIG. 5 shows a preferred embodiment of the flipping device 83 mentioned with reference to FIG. 4. This flipping device 83 is formed as a fork-shaped turnover flap 831 which can be swiveled by 180° around a longitudinal rotational axis 832 extending in the plane of the roller conveyer 82. In horizontal condition, the fork-shaped turnover flap 831 can be lowered halfway into gaps of divided rollers of the roller conveyor 82 so that an arriving workpiece 62 which is exposed on one side can run into the open fork of the turnover flap 831. When this happens, the fork-shaped turnover flap 831 is swiveled around its one longitudinal edge with rotational axis 832 until the turnover flap 831 enters on the continued roller conveyer 82 into gaps which are likewise present between divided rollers of the roller conveyer 82, and the workpiece 62 which is exposed on one side—now with the exposed side facing down—is again deposited on the rollers of the roller conveyer 82 and can run out freely. This way of turning workpieces has the decisive advantage that the workpiece 62 which is exposed on one side does not linger at the location of the rotational axis 832 during the turning process but rather is moved further at virtually the same tempo during the turning. Accordingly, there is no delayed transport so that the handling times are not prolonged by the turning over of the workpiece 62 exposed on one side in the process of changing tables for the exposure of the back side. The sole limiting factor in this flipping device 83 for the throughput of workpieces 62 to be turned is the time interval for swiveling with workpiece 62 and for swinging back without a workpiece, since a further workpiece 62 may not run into the area of the turnover flap 831 during this time interval. However, this time interval is kept open solely through the duration of the exposure process so that the limitation in this case has no effect in the transport path.

Figure 6:
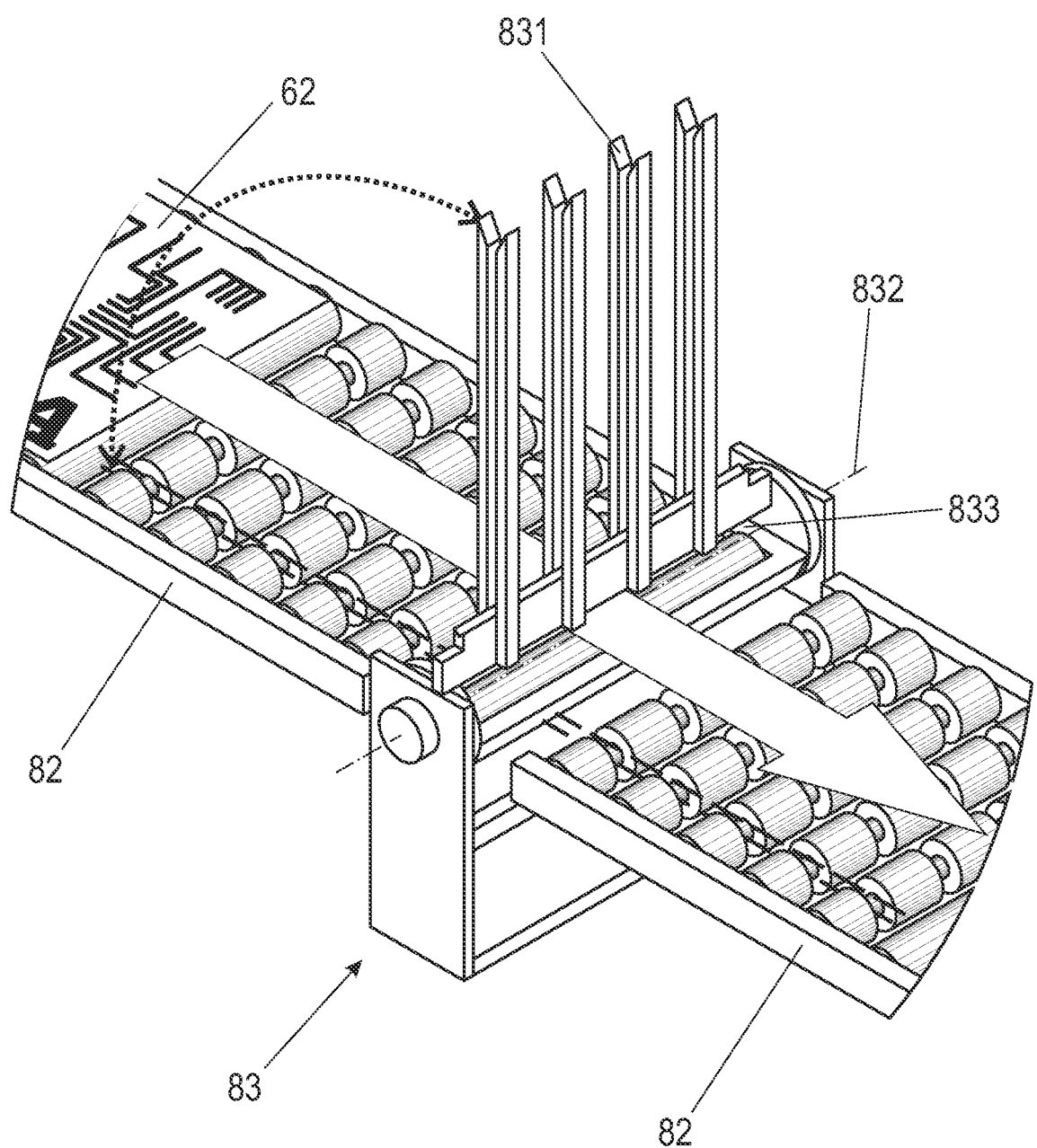
FIG. 6 an advantageous embodiment form of the flipping device with a through-opening when the flipping device is stopped halfway through the swivel path for the alternative passage of a workpiece without flipping.

FIG. 6 shows yet another modification of the turnover flap 831 to also allow a further transporting of workpieces 62 without turning over. To this end, a continuous slot 833 extending exactly in the plane of the top of the rollers of the roller conveyer 82 is incorporated between the longitudinal rotational axis 832 and the fork-shaped turnover flap 831. For the further transporting of workpieces 62 without turning over, the turnover flap 831 needs only be swiveled by 90° and, therefore, vertically upended. In this way, the slot 833 is cleared and the workpiece 62 can pass the flipping device 83 without hindrance or change.

Figure 7:
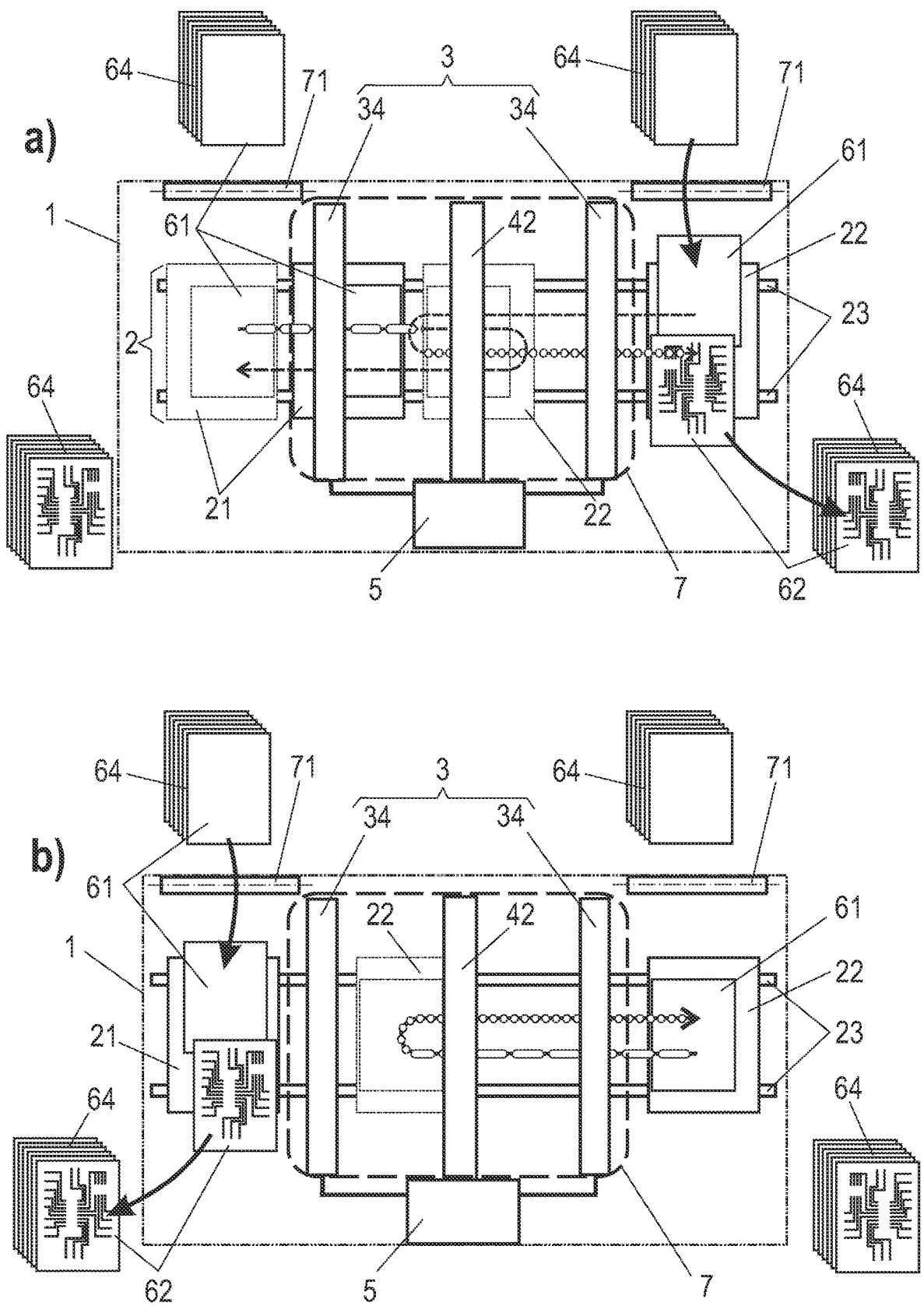
FIG. 7 two views of a processing operation which has been modified over FIG. 1, in which subfigure a) shows the registration and processing of the workpiece situated on the left-hand side and the changing of workpieces on the right-hand side and subfigure b) shows the registration and processing of the workpiece situated on the right-hand side and the changing of workpieces on the left-hand side, and there is a separate registration device for the targets of the workpieces on each exit side of the rail arrangement in the processing housing so that the registration can be carried out on one table in parallel with the processing on the other table.

FIG. 7 shows a processing device 1 which is modified compared to FIG. 1 in the process depictions analogous to FIG. 1. The modification in FIG. 7 consists in that the registration unit 3 comprises two separate registration devices 34 which are directly associated, respectively, with the exits of the processing housing 7, while the processing unit 4 lies in the middle of the processing device 1 as in the previous examples, but in this embodiment, the processing unit 4 is formed as an ink-jet unit 42 by means of which paint or other controlled material coatings, e.g., also LIFT deposits, can be realized. The unloading and loading of the tables 21 and 22 is carried out in the same time sequence as that described referring to FIG. 1. Because the registration unit 3 is divided into two parts, the separate registration devices 34 for each of the tables 21 and 22 are immediately operative at the start of the move-in movement. Accordingly, the first table 21, for example, as is shown in dashed lines in subfigure a), can already receive the targets 33 while the second table 22 is still in the processing operation. The difference between the starting position of the first table 21 shown in dashed lines and the advanced position of the first table 21 shown in solid lines corresponds approximately to the saving of nonproductive times which comes about because of the earlier start time of the first table 21 immediately as the processing of the second table 22 commences. However, it is actually somewhat slower because the registration takes place at higher speed of the first table 21 compared to the processing speed of the second table 22 so that the actual start time of the first table 21 is later and the first table 21 does not catch up to the second table 22 during the processing.

However, as a result of an earlier start time of the first table 21, the registration can be reorganized so that a slower sensing of the targets 33 or even a stoppage of the first table 21 would also be possible in case the targets 33 are arranged in more than two rows (at the edges of the workpiece 6, respectively). In such a case, the first table 21 could even be stopped in order to move one or two cameras 31 in x-direction along an adjusting device so that all of the available targets 33 can be captured.

A situation of this kind actually occurs when there is generated, as workpiece 6, a circuit board panel in which a plurality (e.g., 4, 8 or 16) of separate circuit boards are to be processed on one workpiece 6 and four targets 33 are arranged in each instance on the corresponding portion. In this case, targets 33 would have to be detected at a plurality of positions in x-direction at some y-positions of the table movement and could be sensed by one or two cameras 31 (movable during registration) without the additional cross-sensing causing further nonproductive time.

The remarks made above with respect to reducing nonproductive time by shortening the times at which the first table 21 follows the second table 22 applies equally for the reverse constellation according to subfigure b) of FIG. 7, although this table succession movement is not shown in the same way as in subfigure a).

Figure 8:
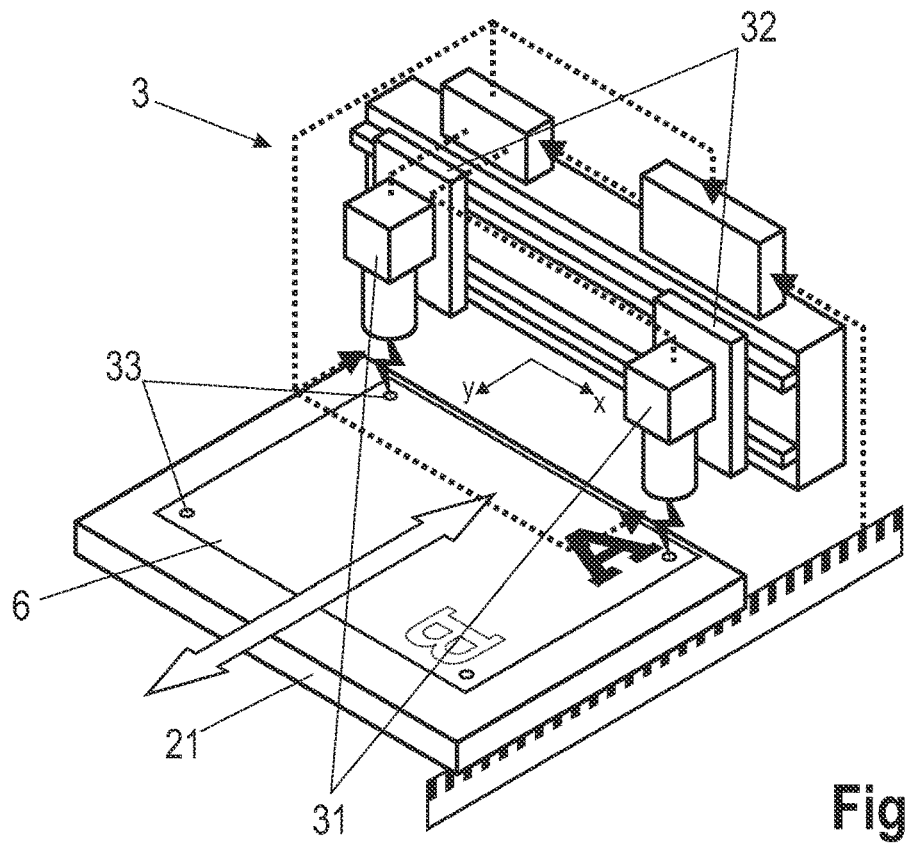
FIG. 8 a diagram of an advantageous embodiment of a registration unit for capturing targets in two strip-shaped areas along the workpiece edges.
Figure 9:
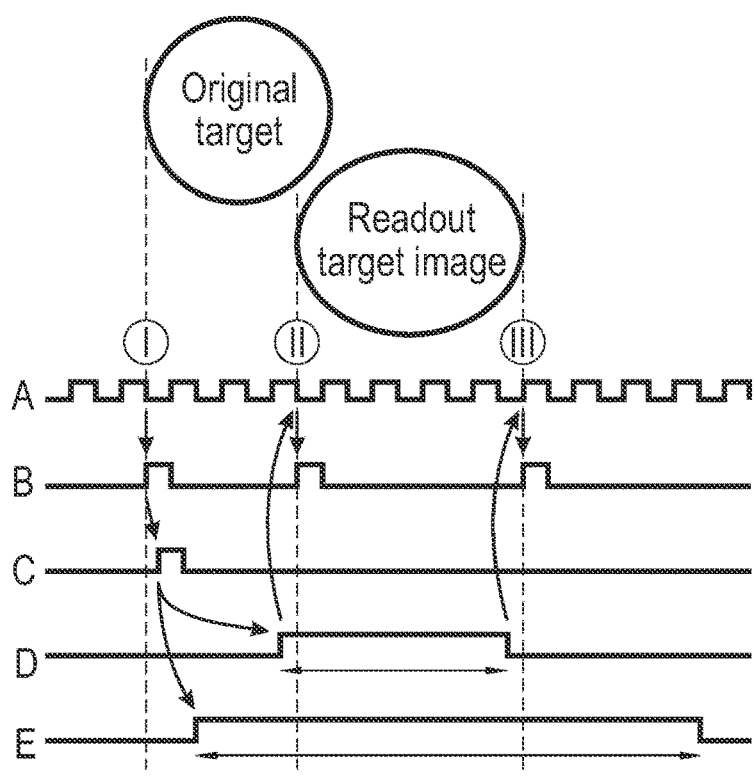
FIG. 9 a timing schema for on-the-fly target registration with a detail showing the target distortion resulting from the table movement.

FIGS. 8 and 9 show the preferred operating principle of the registration unit 3 schematically. In this example, it is assumed that the targets 33 are present on the workpiece 6 in only two tracks along the workpiece edges in the table movement direction (y-direction) so that the registration job can be performed by two cameras 31. The cameras 31 are mounted on camera adjusting devices 32 so that they are adjustable transverse to the table movement direction, i.e., in x-direction, to the dimensions of the workpieces 6 and to any optional position of the targets 33 arranged thereon. As a rule, it is only necessary to adjust once for each workpiece or processing job and the adjustment remains unchanged during the registration process.

Two or more cameras 31 with area sensors or linear sensors are used as sensing or detecting units in the registration unit 3 depending on the quantity of tracks of targets 33.

In the preferred embodiment shown in FIG. 8 for the variant with only two cameras 31, a position-triggered capture process is used with cameras 31, i.e., an illuminating flash which "freezes" the camera image is generated at predetermined positions of the first table 21 during the movement. Typical flash times are less than 5 μs. Next, the image data are read out and a new recording is prepared.

Preferably, circular marks or through-holes are used as targets 33. The timing and distortion of the target imaging which are to be taken into account are shown in FIG. 9. A target distortion brought about by the table movement needs to be allowed for insofar as the selected integration time of the sensors of cameras 31 is not too short. The integration time is adjusted through the corresponding flash duration. For this purpose, the triggering of the signals is carried out as follows.

The scale A ("ruler") is part of the positioning system of the first and second table 21, 22. Control electronics for position acquisition can record current positions of the table 21, 22 during movement by external trigger signals (positions (I), (II), (III) along the clock signal, scale A, of the positioning system of the tables 21, 22).

During the passage of the table 21, 22 with the workpiece 6 placed thereon under the registration unit 3 a trigger signal "measure request" is generated at the anticipated target position (target 33 is located in the field of view (FOV) of the respective camera 31) and the position (I) is stored in the position capture signal B. The same trigger signal is transmitted to the camera electronics (framegrabber) as image readout signal C. The camera 31 thereby receives the shutter signal E and subsequently opens the shutter for image capture. A camera 31 with a so-called global shutter is preferably used for this purpose. In addition, a short flash of light for illuminating the target 33 of the workpiece 6 is triggered with a short time delay to the rising edge of the shutter signal E by means of the flash control signal D. The rising edge of the flash control signal D generates a second trigger signal which causes a storage of the table position (II). The falling edge of the flash control signal D finally generates a third trigger signal which is used for storing the table position (III).

The integration time E of camera 31 is always set to be longer than the maximum possible flash duration of the flash control signal D. The image capture of the target 33 provided on the workpiece 6 is temporally and geometrically distorted during the entire process, because the table 21, 22 is in parallel movement. Both, a temporal position difference, by internal signal propagation times: position (II)-position (I), and a geometric distortion of the image in the camera 31, by the length of the flash time: position (III)-position (II), is brought about.

The actual target position provided for the position of the target 33 on the workpiece 6 is calculated as follows:

Target position="determined position in the field of view"−totalized distortions resulting from time delay of flash triggering+target middle displacement of half of the flash duration ZP=[Pos. II−Pos. I]+[(Pos. III−Pos. II)/2]

Figure 10:
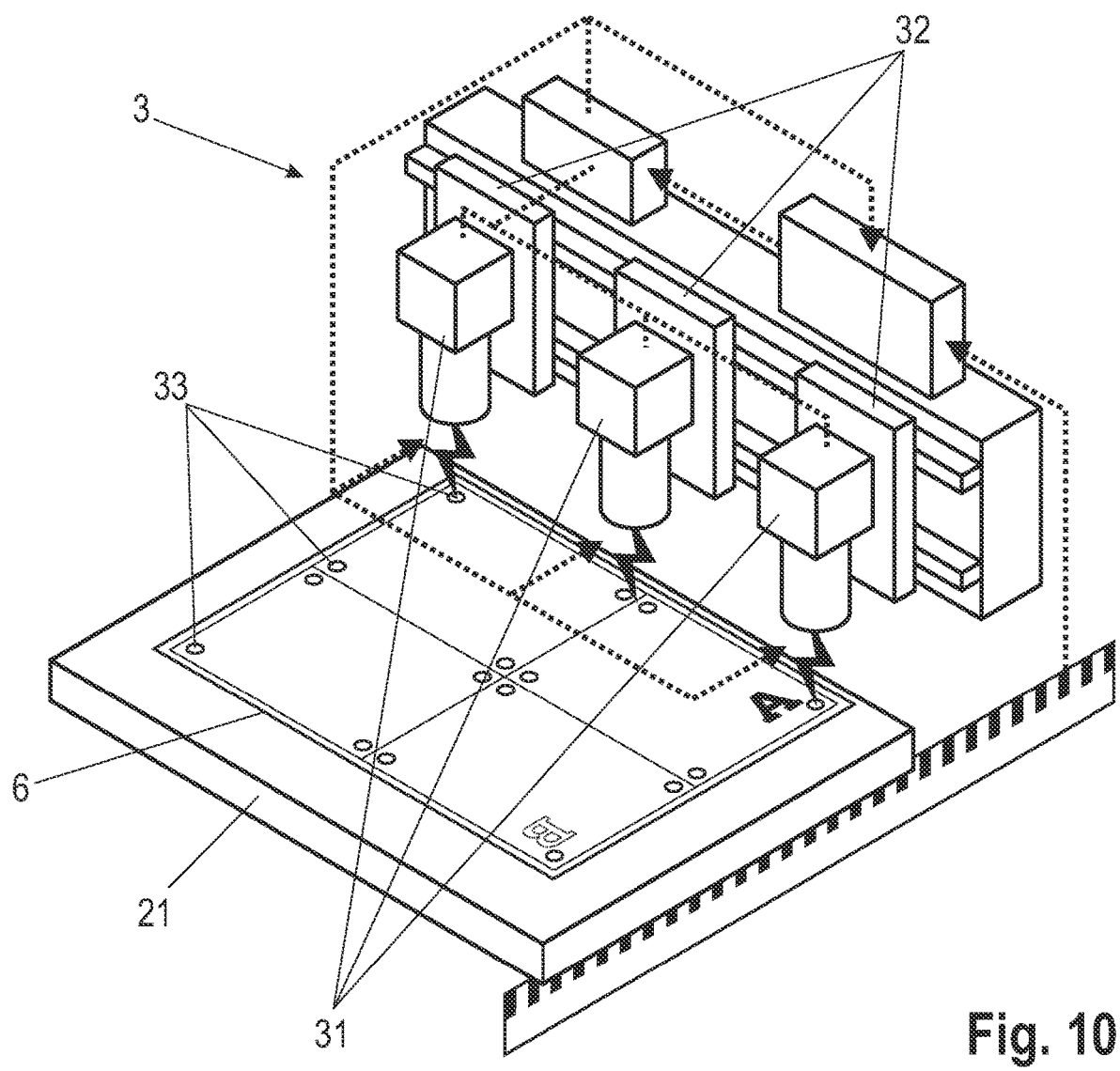
FIG. 10 a diagram of a further advantageous embodiment of a registration unit for capturing targets in three strip-shaped areas.

As schematically shown in FIG. 10 for a commonly occurring preferred circuit board layout, the total workpiece 6 is divided into four quadrants, each of which can by itself contain a plurality of individual circuit boards, and sixteen targets 33 are used for processing. These targets 33 are arranged in each instance at the corners of each quadrant. In this constellation, three area cameras 31 are used according to FIG. 10, whereby the middle camera 31 must be capable of simultaneously acquiring four targets 33 inside of a correspondingly large field of view (FOV) when these targets 33 lie next to one another at the seam of all of the four quadrants. Here the registration scheme is carried out in the three stripes of the targets 33 identically as for the two-striped variant. In the case of the preferred circuit board layout with four quadrants, a total of nine image zones must be acquired during the movement of table 21 with the complete circuit board panel under the cameras 31. Each of the three cameras 31 that are provided for this purpose successively acquires three image zones, respectively, with the targets 33 contained therein in constellations of 1-2-1, 2-4-2 and 1-2-1. In this regard, it is not required that the entire circuit board substrate be acquired gaplessly. Accordingly, the speed of table 21 can be higher than initially determined by the frame rate of the cameras 31. Registration methods of this kind have long been used in direct exposure installations by the firm Orbotech. The principle of data processing to be carried out after target acquisition is described, e.g., in WO 2003/094582 A2 and U.S. Pat. No. 7,508,515 B2.

Figure 11:
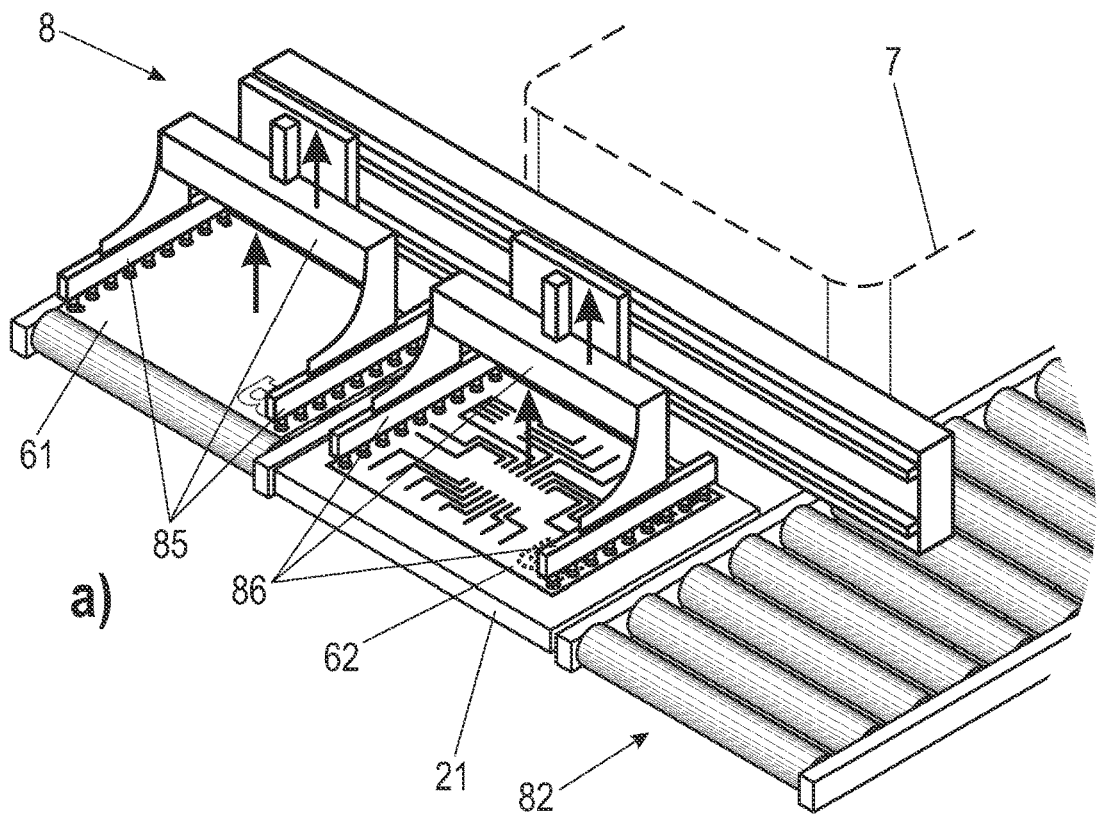
FIG. 11 a two-part diagram (subfigures a and b) showing the loading and unloading process of the two tables according to the arrangement shown in FIG. 4 in an advantageous embodiment with two grippers guided in parallel.
Figure 11:
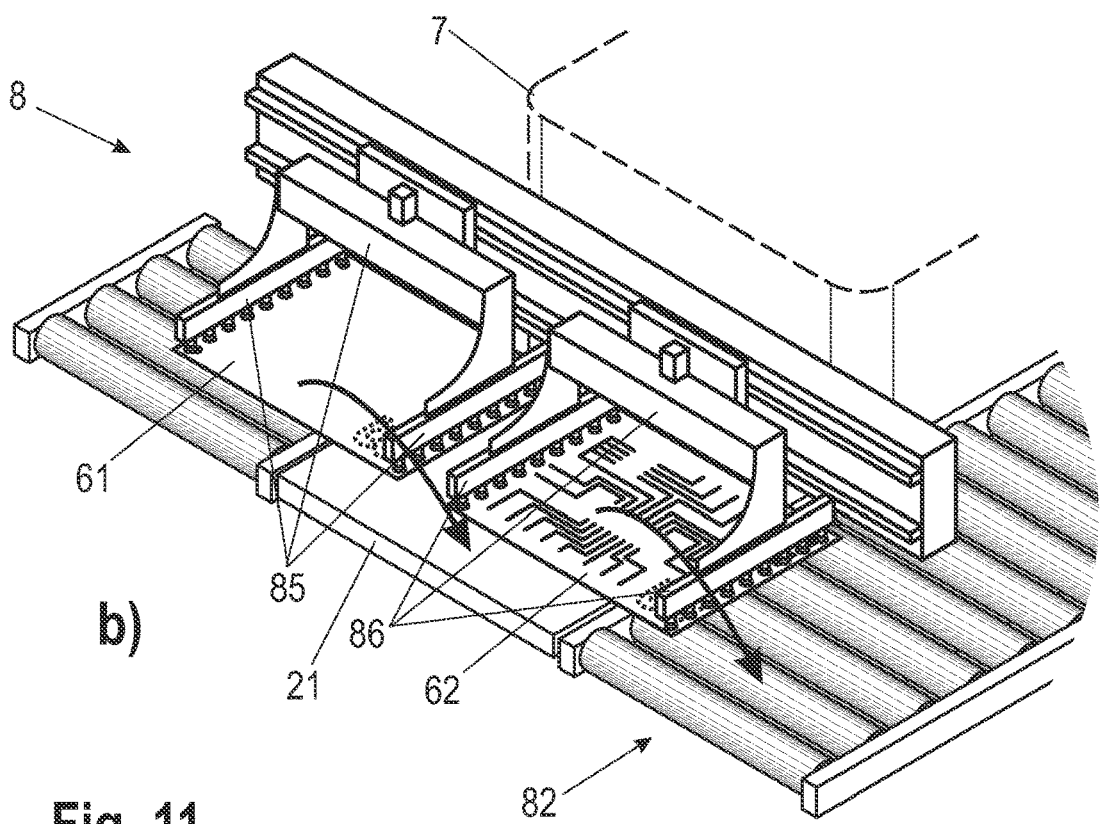

The arrangement of two grippers 85 and 86 moving adjacent to one another that is used for the handling system 8, already described referring to FIG. 4 with respect to the process cycle, based on roller conveyers 82 is shown in detail in FIG. 11. The desired minimization of handling in the area of unloading and loading the tables 21 and 22 is organized in such a way that grippers 85, 86 are movable along x-direction (transverse to the table movement direction) and the movement length is designed to be greater than a table width. Only the unloading and loading process of the first table 21 is described in the following. The process is analogous for the second table 22.

When unloading a workpiece 62 processed on one side from table 21, an unprocessed workpiece 61 is lifted from a feed area of the roller conveyer 82 at the same time that the workpiece 62 processed on one side is received from table 21, as is shown in subfigure a) of FIG. 11, through parallel collinear movement of the two grippers 85, 86 which are movable independently but are preferably guided in a coupled manner. The two grippers 85 and 86 are then simultaneously moved in x-direction past the first table 21. In so doing, the workpiece 62 processed on one side exits the table area and is displaced via roller conveyer 82, while the unprocessed workpiece 61 is moved to the predetermined position on the table 21 and deposited there preferably again synchronously with the workpiece 62 processed on one side. By doubling the gripper arrangement in this way, the handling during unloading and loading of the two tables 21 and 22 is parallelized in such a way that no additional nonproductive time results.

The preceding description applies to the second table 22 in the same way with the sole difference that, in case workpieces 6 are processed on two sides, a workpiece 63 which is processed on both sides is unloaded and the second table 22 is loaded with a workpiece 62 processed on one side. The movement processes of the grippers 85 and 86 are absolutely identical to the movement processes of the first table 21.

Aside from the preferred processing of circuit boards described herein, the processing device 1 according to the invention comprehends all other processing operations of plate-shaped workpieces 6 insofar as a line-by-line linear processing path transverse to the table movement direction through an alignment assisted by targets 33, or control of the alignment, of the workpieces 6 with respect to the processing path s provided and an improvement of efficiency of the processing operation is achieved through minimizing handling times and nonproductive times, possibly with a table-to-table transport for double-sided workpiece processing through the same processing device 1 to increase the workpiece throughput of the processing device 1 by means of a two-table solution on a common rail arrangement 23.

LIST OF REFERENCE NUMERALS 1 processing device (for plate-shaped workpieces)
2 (movable) table system
21 (first) table
22 (second) table
23 (common) rail arrangement
3 registration unit
31 camera
32 camera adjusting device
33 target
34 (separate) registration device
4 processing unit
41 exposure unit
42 ink-jet unit
5 computer unit
6 workpiece
61 unprocessed/unexposed workpiece
62 workpiece processed/exposed on one side
63 workpiece processed/exposed on both sides
64 workpiece stack
7 processing housing
71 cleaner
8 handling system
81 articulated arm robot
811 articulated arm
812 (double-sided) head
82 roller conveyer
83 flipping device
831 (fork-shaped) turnover flap
832 (longitudinal) rotational axis
833 slot
84 gripper (of the articulated arm robot 81)
85, 86 grippers (operated in parallel)
9 machine housing

The invention claimed is:

1. An apparatus for processing plate-shaped workpieces, comprising:
a movable table system for receiving plate-shaped workpieces,
a registration unit above the movable table system for acquiring targets,
a processing unit with a controllable linear processing path for processing the workpiece, and
a computer unit for controlling the alignment between processing unit and workpiece and for spatial differentiation of a predetermined processing depending on a position of the workpiece determined on the basis of the registered targets,
wherein the movable table system has two identical tables on a common rail arrangement with a linear rail area below registration unit and processing unit, both being transversally extended to the linear rail area, so that the tables are movable alternately in a straight line along the common rail arrangement in a conspiring table movement direction to completely cross below the registration unit and the processing unit so that the tables are controllable independently from one another by the computer unit;

wherein the registration unit has a linear orientation transverse to the table movement direction and has at least two sensor areas for spatially detecting targets at least in lateral edge areas of the tables or of the plate-shaped workpieces located on the latter during the passage of one of the tables under the registration unit, so that the position of the workpiece is detectable and a signal is generated for ending a move-in movement and introducing a move-out movement of one of the tables for carrying out the predetermined processing;

wherein the processing unit is arranged parallel to the registration unit and has a controllable processing path in order to carry out a processing of the plate-shaped workpiece line by line; and wherein a transporting system for providing the plate-shaped workpieces for processing on both sides is provided outside of a processing housing and inside of an outer machine housing, with which transporting system workpieces which are processed on one side are directly transferable from the one exit side of the common rail arrangement to another exit side of the common rail arrangement accompanied by a flipping movement.

2. The apparatus according to claim 1, wherein the computer unit is configured for independent control of the two tables with respect to direction, speed of table movement and alternate inward and outward movement of the tables for a purpose of loading and unloading plate-shaped workpieces in order to feed plate-shaped workpieces from two opposite sides of the common rail arrangement for registration of the targets during the inward movement and line-by-line processing during the outward movement depending on the determined position of the targets and a loading and unloading of the respective table which has completely moved out of the processing housing.

3. The apparatus according to claim 1, wherein the computer unit has a retarding device for reversing a direction of a move-in movement to a move-out movement with which a reversal of direction is first triggerable depending on a distance between the registration unit and processing unit when a rear edge of the plate-shaped workpiece has gone beyond the processing path of the processing unit or beyond a detection area of the registration unit depending on which of the two was passed last.

4. The apparatus according to claim 1, wherein the computer unit contains different speed regimes for a move-in movement to a move-out movement of the tables which are adapted to a sensing speed of the registration unit and a predefined processing speed of the processing unit, wherein a mean speed of the move-in movement is selected so as to be faster than a mean speed of the move-out movement.

5. The apparatus according to claim 1, wherein the registration unit has a flash illumination for limiting target sensing to such areas of the tables or plate-shaped workpieces located thereon in which targets are anticipated.

6. The apparatus according to claim 1, wherein one of the tables is provided inside the processing housing during a move-in movement for sensing the targets by the registration unit and during a move-out movement for line-by-line processing by the processing unit, wherein the other table is guided to loading and unloading of the workpieces in a moved-out state outside of the processing housing.

7. The apparatus according to claim 1, wherein two grippers working in parallel transverse to the table movement are provided outside of the processing housing for loading and unloading a table, respectively, at each exit side of the common rail arrangement.

8. The apparatus according to claim 1, wherein two articulated arm robots are provided as the transporting system, which articulated arm robots have a double-sided rotatable head which is configured by rotation of the head to remove a processed workpiece and deposit a workpiece that has not yet been completely processed, and which articulated arm robots are configured to provide a inherent flipping movement by transferring workpieces which are processed on one side from one articulated arm robot to the other.

9. The apparatus according to claim 1, wherein a roller conveyor is provided as the transporting system, which roller conveyor is adjacent to the common rail arrangement and is complemented by a doubled arrangement of grippers which are movable transverse to the table movement to remove a processed workpiece and deposit a workpiece that has not yet been completely processed.

10. The apparatus according to claim 9, wherein a flipping device is integrated in the roller conveyor, which flipping device is formed as a fork-shaped turnover flap which is swivelable at the longitudinal side of the turnover flap in a roller plane of the roller conveyor, wherein the plate-shaped workpiece is movable into fork openings of the fork-shaped turnover flap and out of the fork openings after a swivel movement via conveying rollers of the roller conveyor.

11. The apparatus according to claim 10, wherein the flipping device is formed as a fork-shaped turnover flap in such a way that it is swivelable at its longitudinal side in the roller plane and is fixable in a 90° position with respect to the conveyor plane, wherein the plate-shaped workpiece is movable by the conveying rollers of the roller conveyor through a slot between swivelable longitudinal side and fork elements of the fork-shaped turnover flap without flipping.

12. The apparatus according to claim 1, wherein grippers which are movable transverse to the table movement direction for loading and unloading the respective moved-out table are provided outside of the processing housing at each exit side of the common rail arrangement of the table system, which grippers are formed for simultaneously removing a processed workpiece and placing a workpiece that has not been processed or not yet been completely processed at the exit side of the common rail arrangement in each instance as a doubled arrangement of grippers operated in parallel.

13. The apparatus according to claim 1, wherein the registration unit and the processing unit are arranged as a parallel double unit directly adjacent to one another centrically above the common rail arrangement of the table system in order to sense and process the two tables from both sides with one and the same registration unit and processing unit in each instance, wherein locations of the targets which are detected in an on-the-fly registration and processing regime during a move-in movement of the table and which deviate from a template processing pattern, are to be taken into account immediately during the move-in movement of the table in order to adapt alignment of an exposure pattern to the position of the targets for alignment of the processing pattern by allowing for deviations in the data of the processing pattern.

14. The apparatus according to claim 1, wherein the registration unit is divided into two registration devices which are arranged at both sides of the processing unit so that a regime of simultaneous on-the-fly registration and alternating processing is feasible for both tables.

15. The apparatus according to claim 1, wherein the registration unit for target sensing has at least two cameras arranged on a line transverse to the movement direction of the tables, wherein the position along the line is adjustable depending on an anticipated position of the targets on the workpiece.

16. The apparatus according to claim 15, wherein the cameras are outfitted with a flash device to allow image captures with shutter times during table movement in a longitudinal direction and, additionally, image captures transverse to the table movement during marginal or stopped table movement when a plurality of targets are not arranged in an edge area of the one table or workpiece and when the other table is in a processing regime.

17. The apparatus according to claim 1, wherein the processing unit is formed as a line-by-line scanning exposure unit in order to provide photosensitive layers with an exposure pattern.

18. Apparatus according to claim 17, wherein the exposure unit has a controllable light source for exposure of workpieces with a laser beam scanned by a polygon mirror.

19. The apparatus according to claim 1, wherein the processing unit is formed as a laser processing unit in order to process workpieces by a controlled laser beam by laser ablation or laser cutting.

20. The apparatus according to claim 1, wherein the processing unit is formed as a material deposit unit in order to process workpieces by a controlled material application.

21. The apparatus according to claim 20, wherein the processing unit is formed as a laser processing unit according to laser-induced forward transmission (LIFT) technology in order to apply solid materials of donor layer substrates as coating patterns to workpieces through controlled laser-induced forward transmission.

22. The apparatus according to claim 20, wherein the processing unit is formed as an ink-jet unit in order to apply liquid materials as coating patterns to workpieces by controllable nozzles.

* * * * *